United States Patent
Nakamura et al.

[19]

[11] Patent Number: 5,867,116
[45] Date of Patent: Feb. 2, 1999

[54] MULTI-STAGE INTERPOLATING ANALOG-TO-DIGITAL CONVERSION

[75] Inventors: Katsufumi Nakamura, Cambridge, Mass.; Edmond Patrick Coady, Santa Clara, Calif.

[73] Assignee: Analog Devices, Inc., Norwood, Mass.

[21] Appl. No.: 682,437

[22] Filed: Jul. 17, 1996

[51] Int. Cl.[6] .................................................. H03M 1/36
[52] U.S. Cl. ........................................ 341/159; 341/155
[58] Field of Search ................................... 341/155, 161, 341/159, 156, 158, 160

[56] References Cited

U.S. PATENT DOCUMENTS

| | | | |
|---|---|---|---|
| 4,338,591 | 7/1982 | Tuthill | 341/148 |
| 4,543,560 | 9/1985 | Holloway | 341/144 |
| 4,897,656 | 1/1990 | Van De Plassche et al. | 341/159 |
| 4,897,657 | 1/1990 | Brubaker | 341/159 |
| 5,541,602 | 7/1996 | Opris et al. | 341/161 |

OTHER PUBLICATIONS

Matsuzawa, A. et al., A 10b 30 MHz Two–Step Parallel BiCMOS ADC with Internal S/H, FEB. 15, 1990 IEEE International Solid–State Circuits Conference.

*Primary Examiner*—Howard L. Williams
*Assistant Examiner*—Peguy JeanPierre
*Attorney, Agent, or Firm*—Wolf, Greenfield & Sacks, P.C.

[57] ABSTRACT

In a multi-stage, multi-residue interpolating analog-to-digital converter (ADC), which is suitable for pipelined implementation, inputs of at least three amplifiers are "leap-frog" switched to adjacent nodes of a first interpolation ladder having discrete voltage levels established thereon. Pairs of the amplifiers drive second interpolation ladders to establish additional discrete voltage levels (in a nominal and an overlap conversion region) at nodes of the second interpolation ladders. A bank of comparators compares a predetermined threshold voltage, e.g., ground, to several of the discrete voltage levels at the nodes of the first interpolation ladder. The switches controlling which inputs of the amplifiers are connected to which nodes of the first interpolation ladder are controlled by a logic circuit which is driven by outputs of the bank of comparators. Alternatively, the bank of comparators compares an input voltage of the ADC to voltage levels established by the first interpolation ladder. In which case, the voltages at the nodes of the interpolation ladder to which the amplifiers are connected are amplified with respect to the input voltage of the ADC.

11 Claims, 16 Drawing Sheets

NO OVERLAP RANGE

2

MULTI-STAGE INTERPOLATING ANALOG-TO-DIGITAL CONVERSION

FIELD OF THE INVENTION

The present invention relates generally to analog-to-digital converters (ADCs) and, more particularly, to multi-residue interpolating ADCs.

BACKGROUND OF THE INVENTION

In the electronic field, there is a well recognized need for high-speed, moderate-resolution (i.e., accurate to at least 10 bits) ADCs. There are several known architectures that are suitable for many applications requiring analog-to-digital conversion. Typically, the particular application of a data converter will dictate the architecture that is chosen. Further fine tuning of the chosen architecture will also take place based on the selection of the technology to be used in implementing the converter. It is clear that there is no one optimal architecture for all applications, as all of the known architectures have specific performance advantages and disadvantages, which must be weighed and traded off based on the desired performance goals.

In a low-voltage, e.g., three volt, application, certain implementation problems may arise. For example, it is difficult to implement a high-performance (i.e., high-gain and high-bandwidth) amplifier from a low-voltage supply. Therefore, an ideal ADC architecture would require no amplifiers. To achieve a moderate-resolution conversion with the desired accuracy, however, some amplification is preferred, especially when comparing numerous discrete voltage levels located between reference voltages that are separated by a small voltage difference.

There are two performance specifications that are particularly useful in discussing the relative merit of competing ADC architectures. These include: (1) differential non-linearity (DNL), which is defined as the deviation of the actual code width from the ideal code width; DNL is measured in least significant bits (LSBs), and (2) integral non-linearity (INL), which is defined as the deviation of the converter transfer function from an ideal straight line transfer function; INL also is measured in LSBs and typically is measured with respect to the "best fit" straight line so as not to capture overall converter gain-errors, which are not considered non-linearities.

FIG. 1 is a partial schematic/partial block diagram of a one-step "flash" ADC. As shown, resistor ladder 30, which is connected between voltage node 51 (which receives a high reference voltage $V_{REFT}$) and voltage node 53 (which receives a low reference voltage $V_{REFB}$), provides discrete voltage levels between each of the resistors in the ladder. Each of these discrete voltage levels is provided to the input of a corresponding comparator in comparator bank 29. Input node 84 is connected to the non-inverting input of each of the comparators. Thus, assuming that the voltage $V_{REFB}$ at voltage node 53 is lower than the voltage $V_{REFT}$ at voltage node 51, as the input voltage $V_{IN}$ increases or decreases gradually, each of the comparators will change states (one at a time). The output of comparators in such an arrangement commonly is referred to as a "thermometer code." Encoder 32 receives the "thermometer code" from the outputs of the comparators and provides, for example, an n-bit binary output code.

Due to the fully parallel architecture of such a flash ADC, the converter is able to perform at extremely high conversion rates. To achieve a conversion having an n-bit resolution using a flash converter, however, $2^n-1$ comparators are required. This large number of comparators, in turn, results in a significant consumption of power as well as available die area. The power and area consumed by this architecture grows exponentially with each one-bit increase in the resolution of the converter. In addition, the large number of comparators creates a very large input capacitance seen by input node 84. Therefore, a high performance buffer/amplifier generally is required at the input. For these reasons, flash ADCs typically are restricted to applications requiring a resolution of less than 10-bits.

Implementation of a one-stage "flash" architecture becomes especially difficult if the supply voltage is less than five volts. This difficulty arises because, as the voltage between voltage node 51 and voltage node 53 becomes lower, the voltage difference between the discrete voltage levels created by resistor ladder 30 becomes smaller. That is, because any of the comparators in comparator bank 29 may have an input-referred offset associated therewith, the likelihood that bit-errors (caused by any of such offsets) will appear in the "thermometer code" at the output of the comparators will increase significantly as the difference between the discrete voltage levels is decreased. In other words, if the offset of any comparator is larger than the voltage step between the discrete voltage levels, a bit-error (i.e., a missing code) will result in the "thermometer code." Thus, due to the poor matching properties and limited transconductance of MOS transistors, flash architectures are particularly undesirable for use with CMOS technologies. Therefore, high speed flash ADCs typically are designed for bipolar processes (taking advantage of the excellent matching properties and high speeds attainable with bipolar devices).

An alternative architecture used to perform "flash" analog-to-digital conversions is shown in FIG. 2. This circuit is one implementation of an interpolating flash converter. Amplifiers 58 and 60 represent only two of many amplifiers in amplifier bank 80. Each of these amplifiers has its inverting input connected to a separate node of resistor ladder 30. Voltages at nodes 52 and 54 of resistor ladder 30 are separated by one "coarse" voltage level, which level is determined by the voltage division (of the difference between the reference voltage VREFT and VREFB) that is performed by resistor ladder 30. In FIG. 2, the voltage $V_{REFT}$ is greater than the voltage $V_{REFB}$, so the voltage at node 52 always will be greater than the voltage at node 54. Resistor ladder 56, in turn, is connected (at every fourth node of the ladder) to the outputs of the amplifiers in amplifier bank 80. Each quantizer (e.g., a comparator configured to compare its input with a ground potential, i.e., zero volts) of quantizer bank 82 has an input connected to a corresponding node of resistor ladder 56 in order to compare the voltage at its corresponding node to a ground potential. Each quantizer of quantizer bank 82, therefore, will output a logic-high voltage if its input is above zero volts or a logic-low voltage if its input is below zero volts.

If the voltage $V_{IN}$ at input node 84 is greater than the voltage at node 52, then the outputs of amplifiers 58 and 60 both will be positive and, thus, the voltages at all nodes of resistor ladder 56 that are below node 74 should be greater than zero volts, thereby causing the quantizers of quantizer bank 82 that are connected to the nodes below node 74 to output a logic-high. Similarly, if input voltage $V_{IN}$ is less than the voltage at node 54, then the outputs of amplifiers 58 and 60 both will be negative and, thus, the voltages at all nodes of resistor ladder 56 that are above node 66 should be less than zero volts, thereby causing the quantizers of quantizer bank 82 that are connected to the nodes above node 66 to output a logic-low. It follows, then, that when the voltage $V_{IN}$ at input node 84 is between the voltage at node 52 and the voltage at node 54, at some location in resistor ladder 56 (i.e., either at one of nodes 66, 68, 70, 72 and 74, or at a point internal to one of resistors R1–R4) between the output of amplifier 60 and the output of amplifier 58, the voltage will be equal to zero volts (i.e., a "zero crossing" will occur). Therefore, the quantizers of quantizer bank 82 which are quantizing nodes above this "zero crossing" point will output a logic-low, while the quantizers which are quantizing nodes below this point will output a logic-high. For example, if the "zero crossing" point occurred at a midpoint of resistor R2, quantizers Q2, Q3 and Q4, as well as all quantizers above Q4 in FIG. 2, would output a logic-low signal, whereas quantizers Q1 and Q0, as well as all quantizers below Q0 in FIG. 2 would output a logic-high signal. This results in a "thermometer" output code (which is similar to the "thermometer" code that is output by the comparators in comparator bank 29 (shown in FIG. 1)).

FIG. 3 shows a transfer function of the voltages at each of nodes 66, 68, 70, 72 and 74 in the circuit shown in FIG. 2 (represented by curves 66V, 68V, 70V, 72V and 74V, respectively) versus the input voltage $V_{IN}$ at input node 84. All of the curves in FIG. 3 are plotted assuming that the amplifiers and quantizers are ideal (i.e., the amplifiers and the quantizers have, respectively, no dc-offset or gain-error). The points where each of curves 66V, 68V, 70V, 72V and 74V cross zero-voltage line 86 correspond to the input voltages at which each of quantizers Q0, Q1, Q2, Q3 and Q4, respectively, should switch states.

FIGS. 4 and 5 each illustrate a significant advantage that is achieved by an interpolating flash ADC such as that shown in FIG. 2. Referring to FIGS. 4 and 5, in conjunction with FIG. 2, several curves 62V, 64V, 66V, 68V, 70V, 72V, 74V, 76V and 78V are shown, which curves could correspond, respectively, to the voltage levels at nodes 62, 64, 66, 68, 70, 72, 74, 76 and 78, as plotted against the input voltage $V_{IN}$. In FIG. 4, these curves are shown as they might appear if amplifier 58 had a dc-offset voltage of –1 LSB present on its non-inverting input. Otherwise, the curves in FIG. 4 are plotted assuming that amplifiers 58 and 60 have a gain-error of zero. In FIG. 5, curves 62V, 64V, 66V, 68V, 70V, 72V, 74V, 76V and 78V are shown as they might appear if the gain of amplifier 58 was approximately 30% less than the gain of amplifier 60. Otherwise, the curves in FIG. 5 are plotted assuming that amplifiers 58 and 60 have no input-referred dc-offset.

In FIGS. 4 and 5, dashed curve 88 represents the location of the ideal transfer function for the output of amplifier 58 (i.e., without an input-referred dc-offset or a gain-error) and the dots on zero-crossing line 86, e.g., dot 90, correspond to values of the input voltage $V_{IN}$ at which the quantizers ideally would have switched states if an input-referred dc-offset or a gain-error were not present. Since the quantizers (shown in FIG. 3) are assumed to be ideal (i.e., they will change states when their inputs "cross" zero volts), the intersections of curves 62V, 64V, 66V, 68V, 70V, 72V, 74V, 76V and 78V with the zero output voltage line (i.e., "zero crossing" line 86) may properly be termed "actual zero crossings," whereas the dots, e.g., dot 90, on "zero crossing" line 86 in each of FIGS. 4 and 5 may properly be called "ideal zero crossings." Curve 92 in FIG. 4 represents the DNL of the circuit caused by the (hypothetical) input-referred dc-offset of amplifier 58, and curve 92 in FIG. 5 represents the DNL of the circuit caused by the (hypothetical) gain error of amplifier 58. Further, curve 94 in FIG. 4 represents the INL of the circuit caused by the (hypothetical) input-referred dc-offset of amplifier 58, and curve 94 in FIG. 5 represents the INL of the circuit caused by the (hypothetical) gain error of amplifier 58. These INL values also are represented in LSBs.

Significantly, in FIG. 4 (i.e., an interpolating flash converter having an amplifier with an input-referred dc-offset), although the maximum INL error of the circuit is no different than that of a flash comparator (such as that shown in FIG. 1), the maximum DNL error is improved by a factor of four. In such a flash interpolation circuit, the DNL caused by the input-referred dc-offsets of any of the amplifiers in amplifier bank 80 will be spread among several of the interpolation points between the resistors in resistor ladder 56. Therefore, if resistor ladder 56 had, for example, eight interpolation points between the outputs of amplifiers 58 and 60 (rather than four interpolation points, as shown in FIG. 2), the DNL caused by a one-LSB input-referred dc-offset would be divided effectively by a factor of eight, and the resulting DNL of the ADC would be only one-eighth of an LSB.

In the circuit of FIG. 5 (i.e., an interpolating flash converter having an amplifier with a certain hypothetical gain-error), both the INL and DNL of the ADC caused by a somewhat drastic, i.e., approximately 30%, gain-error between adjacent amplifiers, are acceptable for most applications. But, the non-linearity of an interpolating flash converter that is caused by gain mismatches between adjacent amplifiers is substantially worse than that of standard flash converters (such as that shown in FIG. 1), wherein gain mismatches between adjacent comparators have no effect on the DNL or INL of the flash converter. Therefore, the interpolation architecture essentially trades off a small amount of gain mismatch sensitivity for a reduction in offset sensitivity. In addition, the interpolating flash architecture requires far fewer amplifiers than does the standard flash architecture (which uses amplifiers to compare the input voltage with each and every voltage level), thereby resulting in a significant reduction in the required die area and the power consumption of the interpolating flash ADC.

Another way to obtain high-speed, moderate-resolution, analog-to-digital conversion using CMOS flash convertors (such as that shown in FIG. 1) is to employ a multi-stage pipeline architecture such as that shown in FIG. 6. By using a multi-stage architecture, the total number of comparators required to perform a conversion is reduced significantly. In fact, for a n-bit conversion, the required number of comparators is reduced from approximately $2^n$ (as are required for a full flash convertor) to approximately $2^{n/2+1}$. This reduction in the number of required comparators results in a significant die area and power consumption savings for the ADC. The two-stage pipeline converter shown in FIG. 6 is a specific example of a general class of convertors known as multi-step convertors.

The operation of the two step converter shown in FIG. 6 is fairly straightforward. First, a "coarse" conversion of the voltage $V_{IN}$ at input node 84 is made by n-bit ADC 34, which coarse conversion is an n-bit approximation of the input voltage $V_{IN}$. N-bit digital-to-analog convertor (DAC) 36 converts the n-bit digital approximation (performed previously by n-bit ADC 34) back into an analog signal. This analog signal (representing the "coarse" n-bit approximation of the input voltage $V_{IN}$) is subtracted from the input voltage $V_{IN}$ at subtraction node 44. The result of this subtraction is termed the "residue" of the first n-bit conversion, as it represents the residual portion of the input voltage $V_{IN}$ that was not accurately converted by the n-bit ADC 34. This residue then is amplified by amplifier 38 so as to enlarge the conversion range for a second or "fine" conversion, which fine conversion is performed by m-bit ADC 40. The "fine" m-bit digital word output by m-bit ADC 40 then is passed to adder 42 where it is added to the "coarse" n-bit conversion previously performed by n-bit ADC 34.

Often, as is shown in FIG. 6, the gain of the inter-stage amplifier is set such that the coarse and fine conversions have a one-bit overlap so as to allow for the correction of errors made in the coarse conversion (as discussed further below). When such an overlap is employed, the output of adder 42 provides an (m+n−1)-bit digital word. The two-stage architecture shown in FIG. 6 may be extended further to an arbitrary number of stages, with the residue of each stage being amplified and quantized by the following stage. The limiting example of such an extension is a one-bit-per-stage architecture, which requires only one comparator per added bit of resolution desired.

FIG. 7 illustrates how a gain-error in amplifier 38 can cause significant errors to appear at the output of the pipeline convertor shown in FIG. 6. Upper curves 46 and 48 show the output voltage of amplifier 38 (i.e., the amplified residue) plotted against the input voltage $V_{IN}$ of n-bit ADC 34. Lower curves 50 and 52 in FIG. 7 show the analog representation of the digital output code (CODE) of adder 42 plotted against the input voltage $V_{IN}$ of n-bit ADC 34, which is the same voltage $V_{IN}$ that forms the horizontal axis for upper curves 46 and 48. The transfer function of curve 46 (which represents a situation when the gain of amplifier 38 is ideal, i.e., is exactly equal to $2^{n-1}$), results in a nearly liner correspondence between the input voltage $V_{IN}$ and the digital output code (CODE) (as shown by curve 50). The transfer function of curve 48 (which represents the output voltage of amplifier 38 when its gain is non-ideal, i.e., is less than $2^{n-1}$), results in a digital output code (as shown by curve 52) with numerous non-linearities and possible missing codes.

There are a number of significant characteristics of multi-step convertors that may be noted. In general, the quantizers of each stage need only be accurate (i.e., linear) to the number of bits converted in that particular stage. The DACs and subtraction circuitry, however, must have an accuracy that is commensurate with the remaining accuracy of the convertor. Also, the gain of the inter-stage amplifier, such as amplifier 38 in FIG. 6, must be highly accurate so as to assure the proper quantization in the following stages. This stringent constraint on the accuracy of the inter-stage gain usually dictates that a high-gain amplifier (in a feedback configuration) be employed. The presence of a closed-loop amplifier in the signal path, however, typically limits the overall conversion rate of the pipelined converter.

The addition of sample and hold amplifiers between stages of a multi-step architecture allows adjacent stages to be pipelined, thereby increasing the throughput rate of the convertor. Thus, if the desired accuracy of the DACs, the subtractors, and the inter-stage amplifiers can be attained, such a multi-stage pipelined convertor provides an architecture that can feasibly be implemented using CMOS technology. As mentioned previously, however, the speed limitation of the high-gain amplifier in a feedback configuration normally will limit the overall speed of a multi-stage pipelined convertor.

Multi-stage architectures have the further benefit of reducing the required accuracy of the comparators in the first stage and in each subsequent stage of the convertor. That is, since fewer reference levels are required in the first stage (resulting in a larger voltage difference between adjacent reference levels), and since the residue from each preceding stage is amplified by an amount proportional to the gain of the inter-stage amplifier, the accuracy requirement of the comparators in all of the stages is significantly reduced. By taking advantage of this reduced accuracy requirement, power and die area savings may be realized by employing less accurate comparators, which consume less power and have a smaller size.

Digital error correction is used almost universally in multi-step architectures. Such a correction technique reduces the accuracy requirement of the quantizers in each stage by converting the residue passed to succeeding stages into digital words having an extra bit of accuracy. This extra bit of accuracy in the succeeding stages commonly is referred to as the "overlap" range of the succeeding stage. This extra range should be sufficient to correct any errors made by the preceding quantizer.

FIG. 8 illustrates the coding of two successive stages of a convertor wherein no overlap range is provided and, thus, no digital error correction can be performed. In this case, the ADC, DAC, and subtractor of stage i are ideal, so one voltage step of stage i is amplified to fill the full-scale range of stage i+1. In contrast, FIG. 9 illustrates the coding of the same two stages that are illustrated in FIG. 8, but with a (hypothetical) dc-offset added to two of the voltage levels in stage i. Because of these dc-offsets, the amplified signal range now falls outside of the full-scale input range of stage i+1 (i.e., a wide code or positive DNL results). As shown, this mismatch results in a region of overflow above the top voltage level of stage i+1 and a region of missing codes at the lowest voltage level of stage i+1.

FIG. 10 illustrates how an "over" and "under" overlap range may be used to compensate for quantizer offset errors in a multi-stage pipelined ADC, such as that shown in FIG. 6. As shown in FIG. 10, by reducing the inter-stage gain to ±one-half of the value of the inter-stage gain used in FIG. 9, the signal range of the amplified residue from stage i now falls only in the middle portion of the conversion region of stage i+1. Due to this reduction in the inter-stage gain, the convertor shown in FIG. 6 now can tolerate dc-offset errors of up to one-half of an LSB in the quantizer stage i. For signals that fall in the "over" range of stage i+1, an overlap add is performed to increment stage i's quantization output by one LSB. Signals that fall in the "under" range cause the digital correction circuit to subtract one LSB from the quantization output of stage i. Thus, this digital correction technique greatly eases the constraints imposed on the quantizers employed in each stage.

In a multi-stage ADC architecture (such as that shown in FIG. 6), if the reference voltage for m-bit ADC 40 (e.g., the difference between the voltages $V_{REFT}$ and $V_{REFB}$ in a flash ADC such as that shown in FIG. 1) was passed through a unity-gain amplifier with a percentage gain-error identical to the percentage gain-error of amplifier 38 (shown in FIG. 6), the reference range of m-bit DAC 40 then would match the full-scale range of the amplified residue from the output of amplifier 38. Unfortunately, creating a matching gain-error in a reference-buffer amplifier is not a feasible approach in CMOS. An alternative, but substantially equivalent approach, is to have the amplified residue carry the reference information for the following stage. This approach has been successfully implemented using architectures known as "multi-residue, interpolating converters."

A schematic of a multi-stage, two-residue, interpolating converter is shown in FIG. 11. The operation of this circuit is similar to that of the interpolating flash converter shown in FIG. 2. The inverting inputs of amplifiers 102 and 104, however, are not permanently connected to nodes 118 and 120 of resistor ladder 96, while the inverting inputs of amplifiers 58 and 60 (in FIG. 2) are permanently connected to nodes 52 and 54, respectively, of resistor ladder 30 (as shown in FIG. 2). Rather, leads 110 and 112 are switched so that they are connected only to: (1) the node (of resistor ladder 96) having a voltage level thereon that is closest to the input voltage $V_{IN}$ at input node 84, and (2) the node (of resistor ladder 96) having a voltage level thereon that is next closest to the input voltage $V_{IN}$. This connection of leads 110 and 112 causes the following results: (1) the voltage at node 118 will be greater than or equal to the input voltage $V_{IN}$, and (2) the voltage at node 120 will be less than or equal to the input voltage $V_{IN}$. This, in turn, dictates that: (1) the output of amplifier 102 will be negative, and (2) the output of amplifier 104 will be positive.

Arrow 122 represents the input voltage $V_{IN}$ at input node 84 as it would appear relative to the voltage gradient formed by resistor ladder 96. The locations of the closest and second closest reference voltages (relative to the input voltage $V_{IN}$) are determined by using comparators (not shown) to compare the input voltage $V_{IN}$ with the voltage at each of the nodes of resistor ladder 96. The outputs of these comparators are used as: (1) a digital output representing a first-stage "coarse" quantization of the input voltage $V_{IN}$, which may later be added to "finer" measurements from succeeding stages, and (2) a means to control switches which switch leads 110 and 112 of amplifiers 102 and 104, respectively, to the nodes of resistor ladder 96 which are, respectively, greater than (or equal to) and less than (or equal to) the input voltage $V_{IN}$ at input node 84.

As previously mentioned, the switching of leads 110 and 112 such that they surround the input voltage level dictates that the voltage at the output of amplifier 102 will be negative and the voltage at the output of amplifier 104 will be negative. Therefore, at some point in resistor ladder 98, the voltage will transition from a negative voltage to a positive voltage, i.e., a "zero crossing" will occur. In the example of FIG. 11, arrow 124 represents the relative location of this "zero crossing" along the voltage gradient formed by resistor ladder 98. In an identical manner as with the interpolating flash circuit shown in FIG. 2, quantizers (not shown) are connected to each of the interpolating nodes of resistor ladder 98 in order to determine between which two nodes a "zero crossing" occurs. As with the first stage, the outputs of the quantizers are used: (1) as a second-stage digital output, which represents a digital approximation of the residue from the first stage (i.e., the portion of the signal not accurately represented by the digital value determined by the first stage), and (2) as a means to control switches which connect leads 114 and 116 of amplifiers 106 and 108, respectively, to adjacent nodes of resistor ladder 98 that surround the determined location of the "zero crossing" of resistor ladder 98.

Due to this switching, the voltage at lead 114 should be negative and the voltage at lead 116 should be positive, causing the outputs of amplifiers 106 and 108 to be, respectively, negative and positive as well. This creates a "zero crossing" along the voltage gradient formed by resistor ladder 100, which "zero crossing," in this example, is represented by arrow 126. As with the second stage, resistor ladder 100 has quantizers connected to each of its nodes to determine the location of the "zero crossing" and output a corresponding digital output code.

A multi-stage, two-residue architecture (such as that shown in FIG. 11) has several advantages over basic interpolating flash ADCs (such as that shown in FIG. 2). One such advantage is a significant reduction in the number of amplifiers and comparators that are required for its implementation (as compared to the flash or interpolating flash architectures discussed previously). This reduction in the required number of amplifiers and comparators is due, in part, to the fact that the circuit elements used in the successive stages are switched to be connected to the appropriate inputs (rather than being duplicated in the circuit), and results in a significant reduction of the power consumption and required die area of the circuit.

Another advantage attained by a two-residue structure is illustrated in FIG. 12. FIG. 12 shows transfer functions of the voltages at the outputs of amplifiers 102 and 104, as well as the voltages at several resistor ladder nodes therebetween, versus the input voltage $V_{IN}$ at input node 84. As shown, curves 128A and 130A represent the outputs of amplifiers 102 and 104, respectively, when both of these amplifiers have a gain equal to A. Similarly, curves 128B and 130B represent the outputs of amplifiers 102 and 104, respectively, when both of these amplifiers have an gain equal to B. The lines between curves 128A and 130A and between curves 128B and 130B represent the voltages at several of the nodes of resistor ladder 98. The parallel dashed lines, e.g., line 132, illustrate how the "zero crossings" of each of the nodes of the resistor ladder occur at the same location regardless of the gain setting of amplifiers 102 and 104, so long as the gain of amplifier 102 substantially matches the gain of amplifier 104.

Interestingly, if both of amplifiers 102 and 104 have linear settling (i.e., no slewing), then complete settling is not required in order to obtain converter linearity. This property is in stark contrast to standard multi-step architectures (such as that shown in FIG. 6), wherein complete settling of the inter-stage amplifier is paramount to the performance of the converter. In fact, the settling time of the interstage amplifier in a multi-step ADC architecture typically is the speed-determining factor of such an ADC. Thus, the fact that the amplifiers in a two-residue architecture do not have to settle completely significantly eases the performance requirements of these amplifiers.

FIG. 13 illustrates a switching scheme for the amplifiers in a two-residue architecture. Resistor ladder 142 in FIG. 13 could, for example, correspond to resistor ladder 98 in FIG. 11, and amplifiers 134 and 136 in FIG. 13 could correspond, respectively, to amplifiers 106 and 108 in FIG. 11. Arrow 138 in FIG. 13 represents the "zero crossing" of resistor ladder 142 and voltage source 140 represents an input-referred dc-offset of amplifier 136. As depicted by phantom amplifiers 134P and 136P, when amplifiers 134 and 136 are switched between nodes of resistor ladder 142, they do so in a "sliding" fashion. That is, the inputs of amplifiers 134 and 136 both are switched to be connected to the next adjacent node in resistor ladder 142.

Referring now to FIG. 14, in conjunction with FIG. 13, the output voltages of amplifiers 134 and 136 are plotted as curves 134V and 136V, respectively, versus the input voltage of the circuit. If it is assumed that the location of the "zero crossing" shown by arrow 138 initially occurs just below the node of the resistor ladder to which the input of amplifier 134 is attached, then as the input voltage is increased slightly, amplifiers 134 and 136 will be switched so that amplifier 136 will be connected to the node to which amplifier 134 was initially attached and amplifier 134 will be connected to the node just above the node to which it initially was attached. This manner of switching causes the offset voltage at the input of amplifier 136 to appear suddenly at the ladder node to which amplifier 134 was previously attached. This voltage step causes the transfer function of the converter to be irregular, as represented by curve 146 in FIG. 14. As shown in FIG. 14, line segment 150 (which could represent an interpolated voltage at a node of resistor ladder 142 between the outputs of amplifiers 134 and 136) does not intersect "zero crossing" line 144. This non-intersection with the "zero crossing" line, in turn, would result in a missing code (i.e., a DNL error of −1 LSB) after every "sliding" switch of amplifiers 134 and 136. The effect of these missing codes on the output code is illustrated by curve 146 in FIG. 14, as compared to curve 148, which represents how the output code curve might appear with no amplifier offset.

FIG. 15 is identical to FIG. 13, except that amplifiers 134 and 136 now are switched using a "leapfrog" method, as is illustrated with phantom amplifier 136P. With the switching scheme shown in FIG. 15, however, if it again is assumed that the "zero crossing" point initially occurs at a location just below the resistor ladder node to which the input of amplifier 134 initially is attached (as indicated by arrow 138), when the input voltage is increased slightly, the quantizers connected to resistor ladder 142 will cause the input of amplifier 136 to switch to the node just above the node to which amplifier 134 is attached. This manner of switching means that the offset voltage will not appear suddenly at a ladder node that is very close to the "zero crossing" point of ladder 142. Rather, the offset voltage will appear at a ladder node that is an entire (coarse) voltage level above the "zero crossing" point. Therefore after a "leapfrog" switch of the amplifiers, the quantization error introduced by any offset voltage will be "spread" between the interpolated voltage levels between the outputs of amplifiers 134 and 136, thereby substantially reducing its deleterious effect on the DNL of the converter.

The output voltages (relative to the input voltage $V_{IN}$) of amplifiers 134 and 136 are shown in FIG. 16 as curves 134V and 136V, respectively. The line segments, e.g., line segment 150, represent the voltages at the nodes of resistor ladder 142 between the outputs of amplifiers 134 and 136. As shown in this example, each of these interpolated line segments intersects "zero crossing" line 144, resulting in a "zero crossing" for each interpolation node. An analog representation of the output code of the converter corresponding to the output voltages shown thereabove is represented by curve 148 in FIG. 16, as compared to ideal code curve 146. As a result of this "leapfrog" switching scheme, while the INL of the converter suffers slightly, since there is no abrupt voltage transition when an amplifier having an offset is switched to a new node (as previously explained in connection with the discussion of FIG. 14), the DNL is significantly improved. That is, there should be no missing codes so long as the input-referred offset of the amplifiers is less than the difference between (coarse) voltage levels of resistor ladder 142.

Still referring to FIG. 15, since amplifiers 134 and 136 are "leapfrog" switched responsive to the detection of a "zero crossing" at each node of resistor ladder 142, any offset in the quantizers (e.g., dc-offset voltages at the inputs of comparators) may cause the amplifiers to be switched too early or too late. That is, instead of detecting a "zero crossing," the quantizers might detect a crossing at a voltage that is slightly less than zero or slightly greater than zero. This early or late switching could result in missing codes if the offset of the quantizers is large enough.

One solution to the problem of early or late switching of the quantizers is to create an "overlap range" which extends beyond the nominal resolution of the interpolating ladder that is connected between the outputs of the two amplifiers. This overlap scheme is illustrated in FIGS. 17(a) and 17(b). FIG. 17(a) shows amplifiers 134 and 136 having only a nominal conversion range between their outputs, whereas FIG. 17(b) shows the amplifiers having an artificially created "over" range above the output of amplifier 134 and an "under" range below the output of amplifier 136. The nodes of the interpolation ladder in these "over" and "under" ranges may be quantized as are the nodes between the outputs of amplifiers 134 and 136. Using this overlap arrangement, if amplifiers 134 and 136 are switched either too early or too late so that a "zero crossing" occurs at, for example, node 152 or node 154 of resistor ladder 156, the location of this zero crossing will be recognized to have occurred in the "over" or "under" range and the code quantized by the previous stage may be corrected digitally. For example, correction may be accomplished by adding or subtracting one bit from the digital output code of the previous stage. This overlap range and addition (or subtraction) of bits is conceptually identical to the overlap range and addition (or subtraction) of bits discussed in connection with the multi-stage flash ADC shown in FIG. 6.

Referring still to FIG. 17(b), for this overlap scheme to function properly, the voltage steps of the "over" and "under" ranges should (substantially) match the voltage steps of the nominal range. Since the "over" and "under" ranges are artificially created (e.g., using current sources 158 and 160), however, it is unlikely that the voltage steps of these ranges will match the voltage steps of the nominal range. Such a mismatch between conversion ranges may cause converter DNL. One solution of this problem of mismatching between the voltage levels of the overlap and nominal ranges is to amplify the residues of three nodes of the first interpolation ladder and perform interpolation between the outputs of all three amplifiers.

An example of this three-residue scheme is shown in FIG. 18. As shown, the residue between the voltage level at each node of resistor ladder 162 and the input voltage $V_{IN}$ at input node 84 is amplified and provided at the output of each of the amplifiers in amplifier bank 164. Comparators, e.g., comparator 170, have inverting inputs positioned at the midpoints of the resistors in resistor ladder 162 so as to receive a voltage that is offset from the voltages at the nodes of resistor ladder 162 by one-half of a voltage step. A comparison of these voltages at levels (intermediate to the voltage levels of the resistor ladder) will cause switches 172, 174 and 176 to switch block 168 (in a sliding fashion) to three adjacent output nodes of particular amplifiers in amplifier bank 164. Block 168 includes buffers 173, 175 and 177 (which are connected to one pole of switches 172, 174 and 176, respectively) and interpolation ladders 179 and 181 which are connected to the outputs of buffers 173, 175 and 177, as shown.

Using three residues in this manner has at least one significant advantage in that "over" and "under" conversion ranges (in addition to a nominal conversion range) are inherently created by such an architecture. That is, since switches 172, 174 and 176 are connected between the outputs of three adjacent amplifiers (rather than between the outputs of only two amplifiers), extra voltages levels (i.e., voltage levels that are not required for a "nominal" range conversion) are generated by interpolation ladders 179 and 181. The "over" and under ranges of the amplifier may then be employed in a similar manner as the "over" and "under" ranges were employed in the circuit of FIG. 17(b). The voltage levels in one section of an interpolation device (internal to fine comparator block 168) is used to perform the "nominal range" conversion, and other portions of this interpolation device may be used to perform an "under" or "over" range conversion, if required, for example, due to an offset of a comparator, e.g., comparator 170.

The conversion scheme shown in FIG. 18, however, has several drawbacks. One drawback is that amplifier bank 164 requires a large number of amplifiers to achieve the desired resolution. Such a large number of amplifiers will consume a large amount of die area and power. Another drawback is that DNL errors may arise due to the fact that fine comparator block 168 is switched (between the outputs of the amplifiers in amplifier bank 164) in a "sliding" fashion. Any offset or gain differential on, respectively, an input of an amplifier or between a particular pair of amplifiers in amplifier bank 164 may cause a "spreading" and/or "narrowing" of the interpolation steps between the outputs of two of the amplifiers, as is illustrated in FIGS. 4 and 5. Due to this possible difference in the size of the voltage level steps between the outputs of any two adjacent amplifiers, the size of the voltage level steps in the "over" or "under" range (if used) will not necessarily match the size of the voltage level steps in the next "nominal" range after fine comparator block 168 is switched to the next adjacent set of amplifier outputs. Consequently, this mismatch between the size of the voltage level steps of the nominal range and the "over" or "under" range of a three-residue scheme may result in DNL errors.

It therefore is a general object of the invention to provide an improved interpolating ADC that overcomes several of the disadvantages and drawbacks of prior art ADCs.

SUMMARY OF THE INVENTION

An interpolating ADC architecture according to the invention employs: (1) a unique and advantageous amplifier switching scheme to amplify at least three residues of a quantization performed by a previous stage and/or, (2) buffers at the outputs of the amplifiers, which buffers drive an extra interpolation ladder. These techniques serve to overcome some of the aforementioned disadvantages and drawbacks of prior art ADC circuits.

According to one aspect of the present invention, an ADC circuit includes: (a) a first interpolation ladder which establishes several voltage levels at various nodes of the first interpolation ladder, (b) at least three amplifiers having inputs that, responsive to a particular input signal level of the ADC, are each switchably coupled to a selected one of the nodes of the first interpolation ladder, (c) comparison components which compare the voltage levels at the nodes of the first interpolation ladder to an input signal level and/or a predetermined signal level to determine which inputs of the amplifiers should be switchably coupled to which of the nodes of the first interpolation ladder, and (d) a second interpolation ladder which establishes several voltage levels at its nodes based upon the outputs of the amplifiers.

According to an additional aspect, the inputs of the amplifiers, responsive to any input signal in a nominal input signal range of the ADC, generally are switchably coupled to three nodes of the first interpolation ladder that are either adjacent to one another or spaced apart by one node.

According to yet another aspect, the number of amplifiers having inputs selectively coupled to the nodes of the first interpolation ladder is equal to the number of voltage level steps included in a nominal conversion range of the first interpolation ladder.

According to another aspect of the invention, an ADC circuit includes: (a) several amplifiers which drive a first interpolation ladder to establish several voltage levels at discrete nodes of the first interpolation ladder, (b) several buffers coupled to the outputs of the amplifiers, which buffers drive a second interpolation ladder which is configured to establish substantially identical voltage levels as does the first interpolation ladder.

According to yet another aspect of the invention, a method for switching the inputs of at least three amplifiers to various nodes of a interpolation ladder includes: (a) comparing several voltage levels to an input signal level and/or a predetermined signal level to establish a thermometer code output, and (b) responsive to the thermometer code output, leapfrog switching the inputs of at least three amplifiers to various nodes of the interpolation ladder.

DETAILED DESCRIPTION OF THE INVENTION

Figure 1:
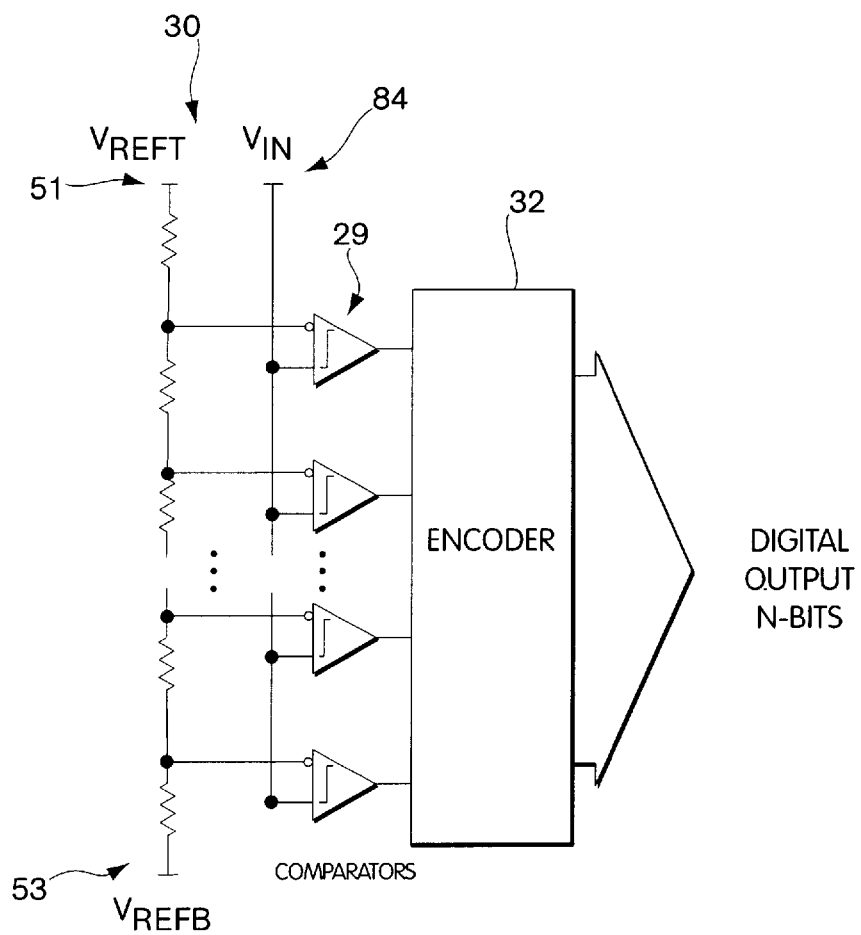
FIG. 1 is a partial schematic/partial block diagram of a prior art flash ADC.
Figure 2:
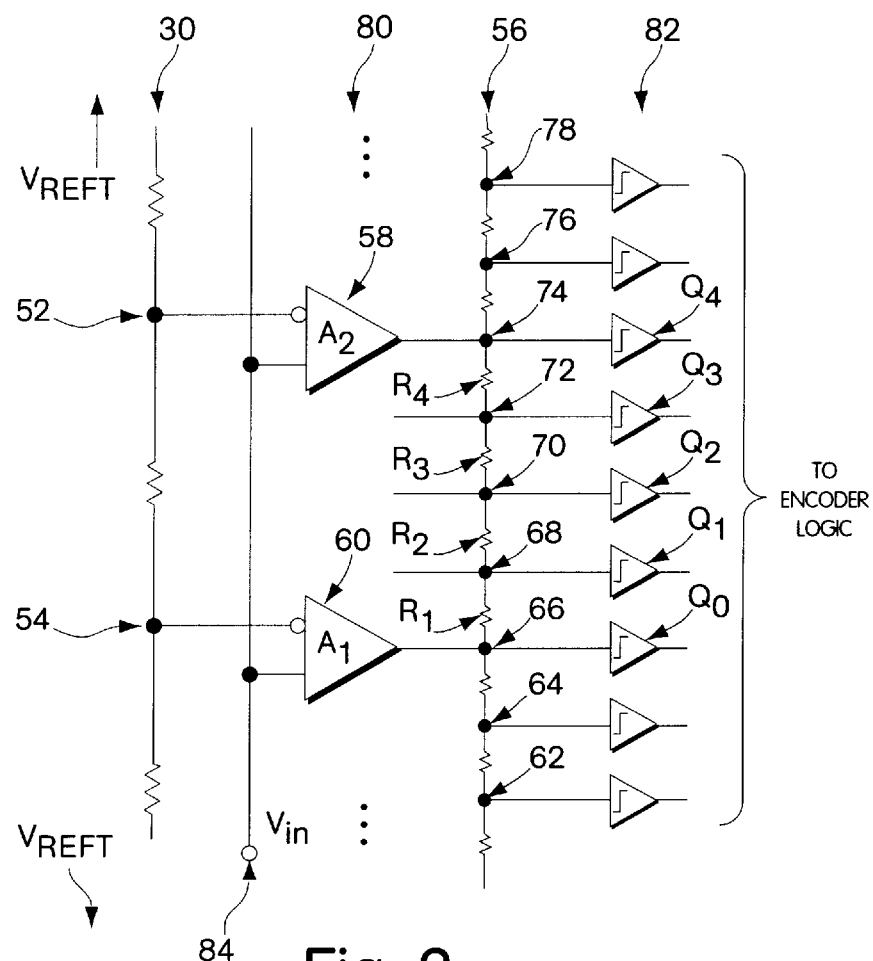
FIG. 2 is a schematic diagram showing a section of a prior art interpolating flash ADC.
Figure 3:
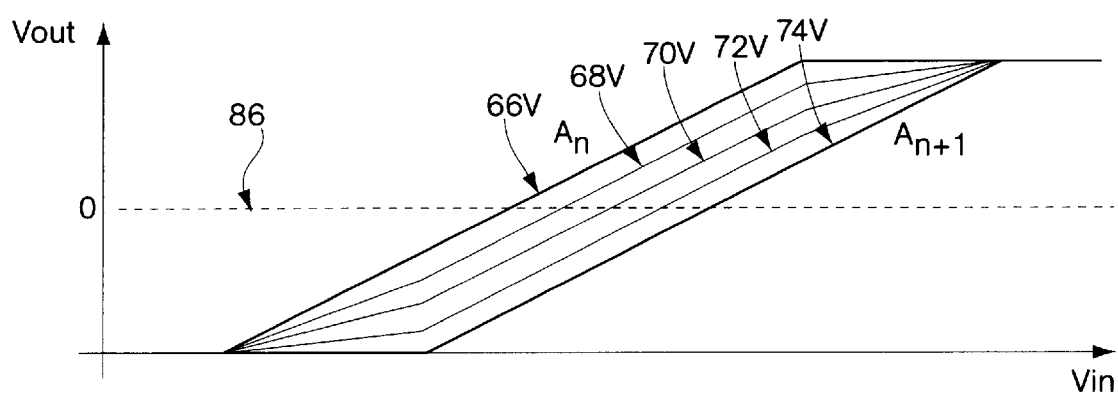
FIG. 3 is a graph showing a typical transfer function of the voltages at several nodes of the circuit shown in FIG. 2 versus the input voltage of the circuit.
Figure 4:
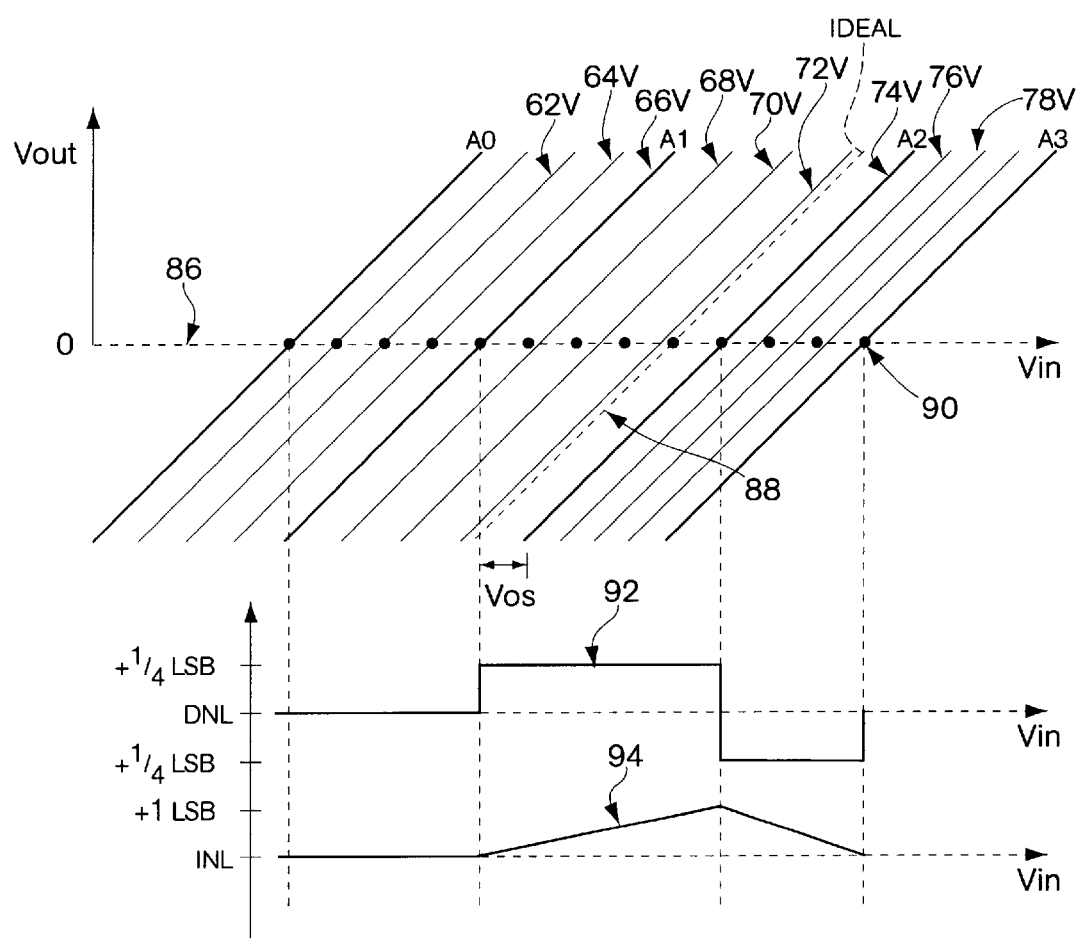
FIG. 4 is a graph showing how an input referred offset on an amplifier may affect a transfer function and the linearity characteristics of the circuit shown in FIG. 2.
Figure 5:
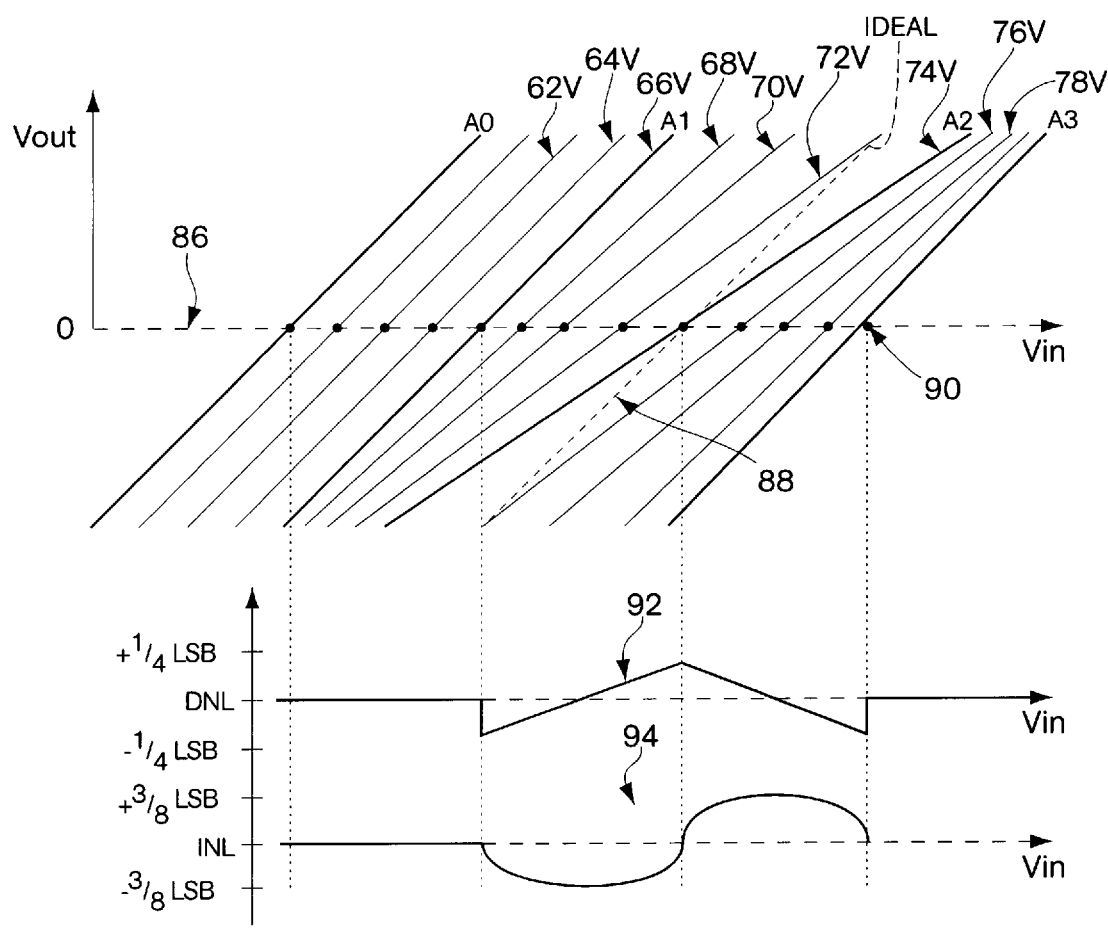
FIG. 5 is a graph showing how a gain differential between adjacent amplifiers may affect a transfer function and the linearity characteristics of the circuit shown in FIG. 2.
Figure 6:
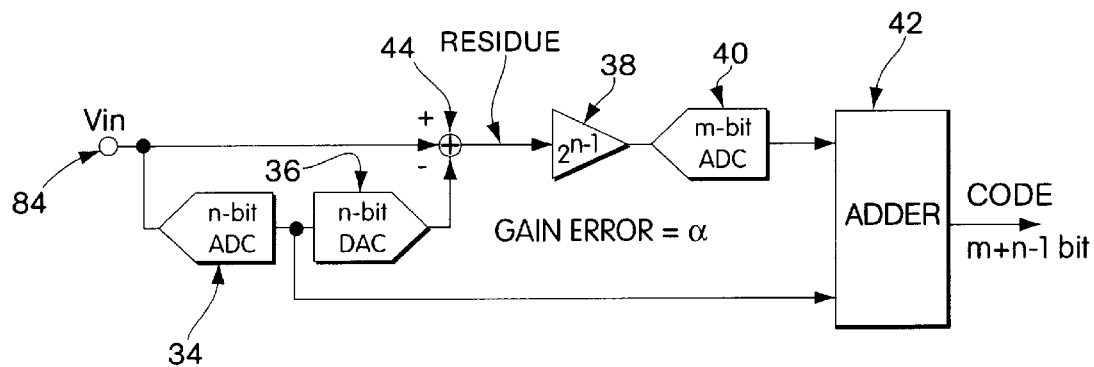
FIG. 6 is a block diagram of a prior art two-stage ADC.
Figure 7:
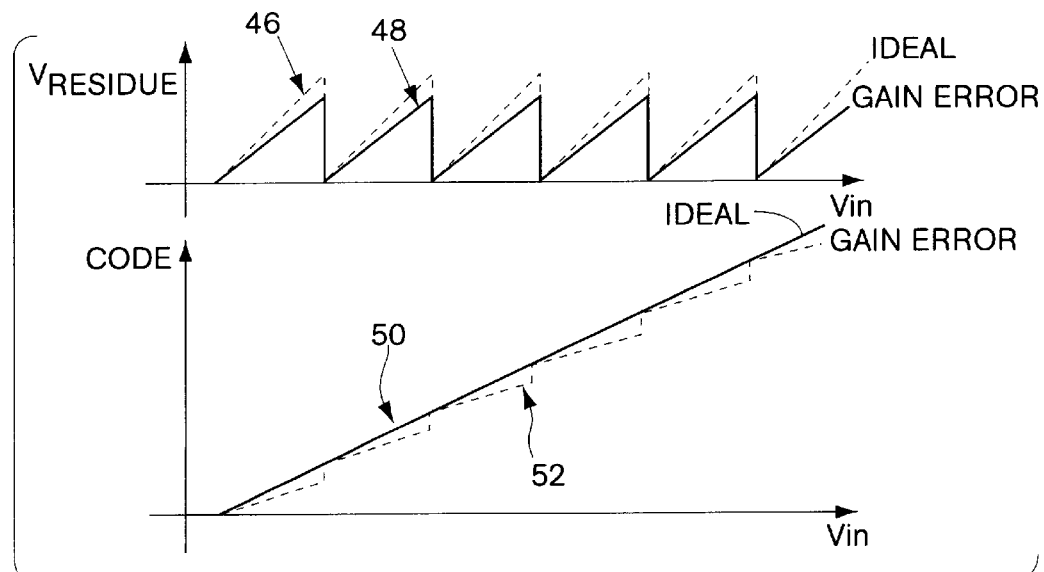
FIG. 7 is a graph showing how an interstage gain error may adversely affect the linearity of the two-stage ADC shown in FIG. 6.
Figure 8:
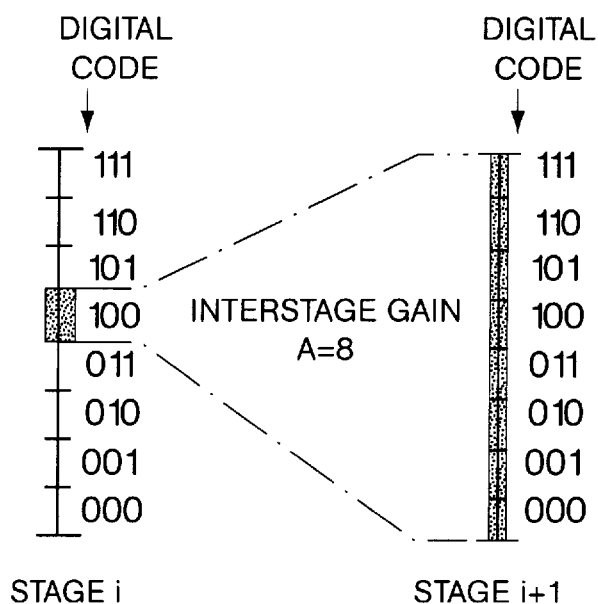
FIG. 8 is a pictorial representation of how the residue from a single quantization level in one stage of a multi-stage ADC may be amplified to fill a full scale quantization region of the succeeding stage.
Figure 9:
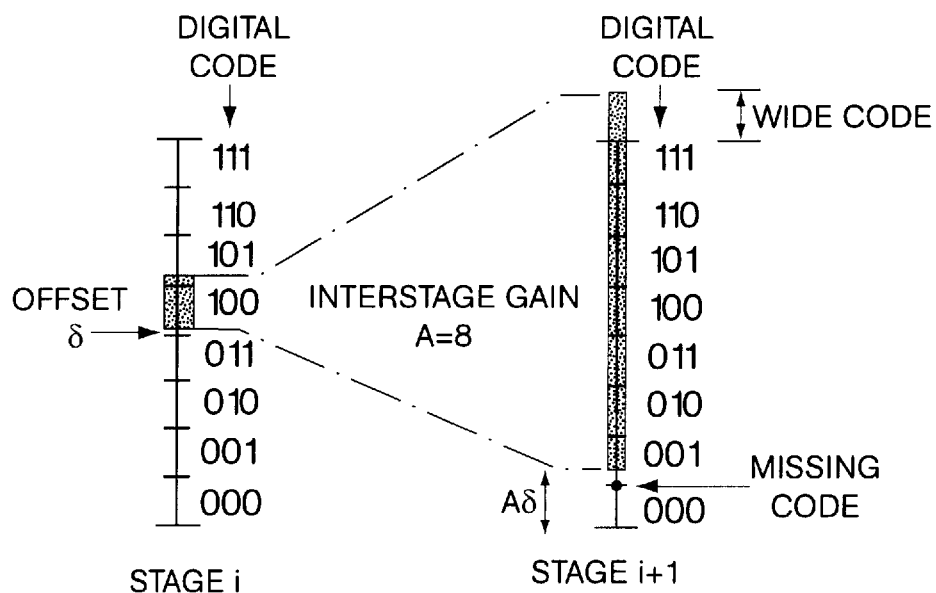
FIG. 9 is a pictorial representation of how the dc-offset of comparators may adversely affect the linearity of a multi-stage ADC.
Figure 10:
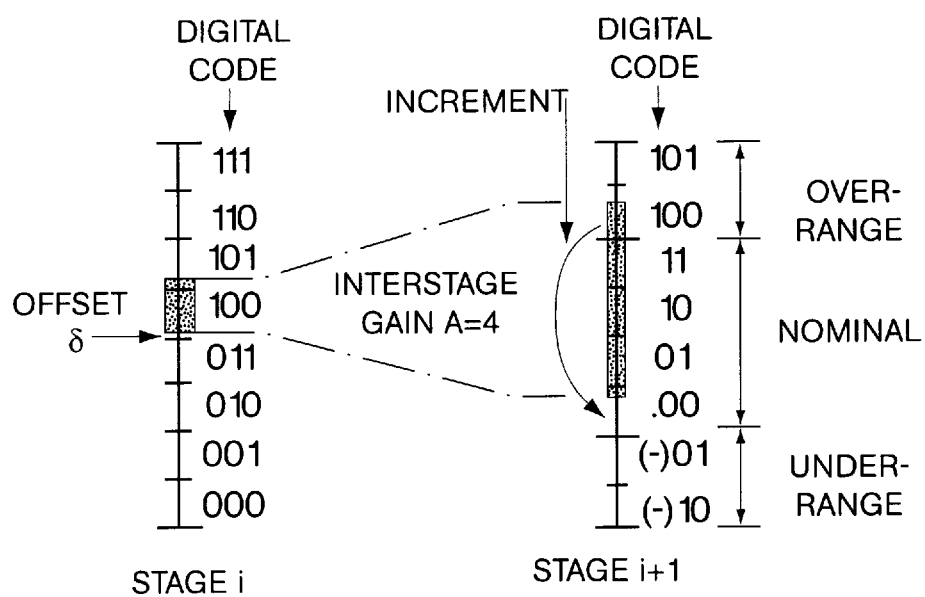
FIG. 10 is a pictorial representation of how the interstage gain of a multi-stage ADC may be reduced so as to create an overlap region which may be used to correct errors in the output code that are caused, for example, by dc-offsets of comparators in the circuit.
Figure 11:
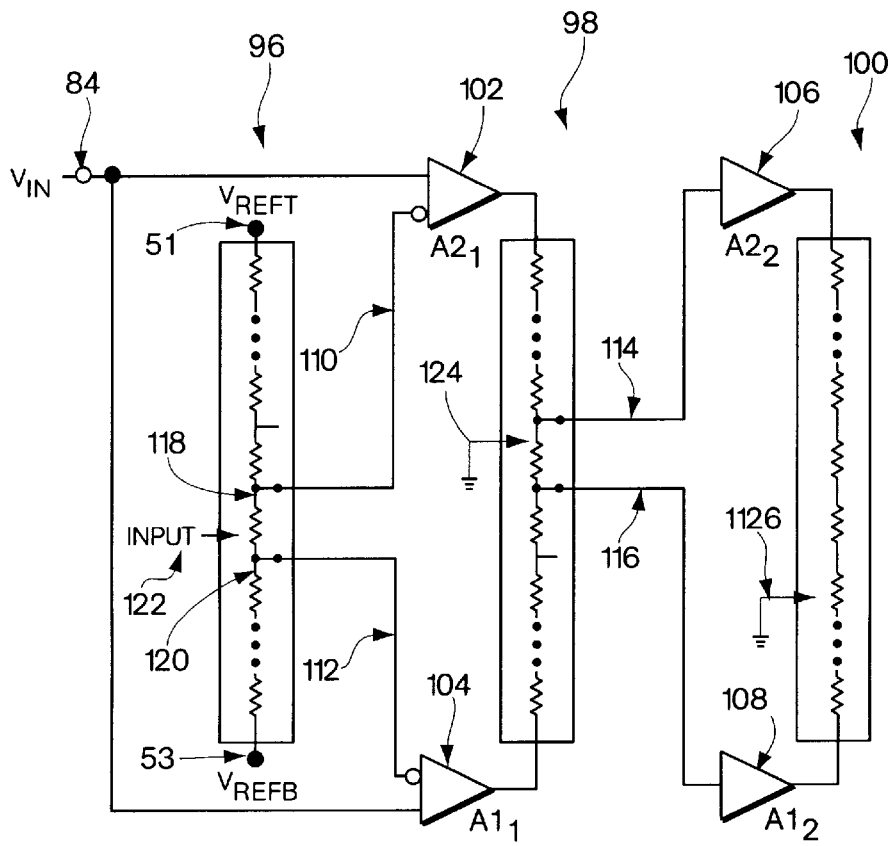
FIG. 11 is a schematic diagram of a prior art multi-stage, two-residue, interpolating flash ADC.
Figure 12:
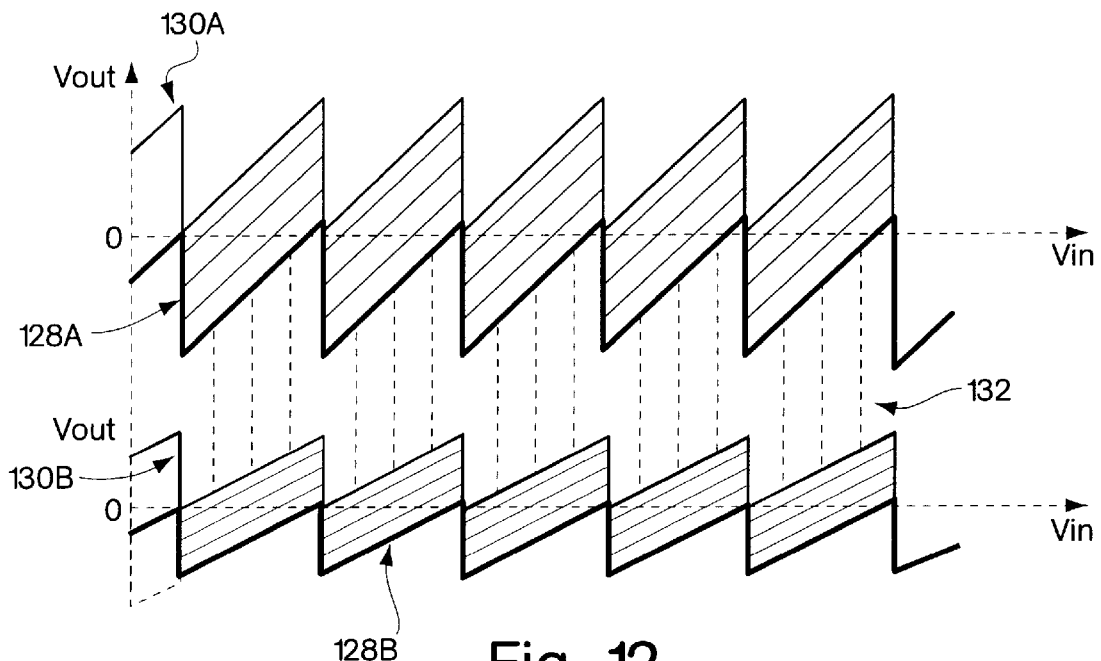
FIG. 12 is a graph showing how equal changes in the gain settings of the pairs of amplifiers driving the interpolation ladders shown in FIG. 11 will not necessarily affect the performance of such an ADC circuit.
Figure 13:
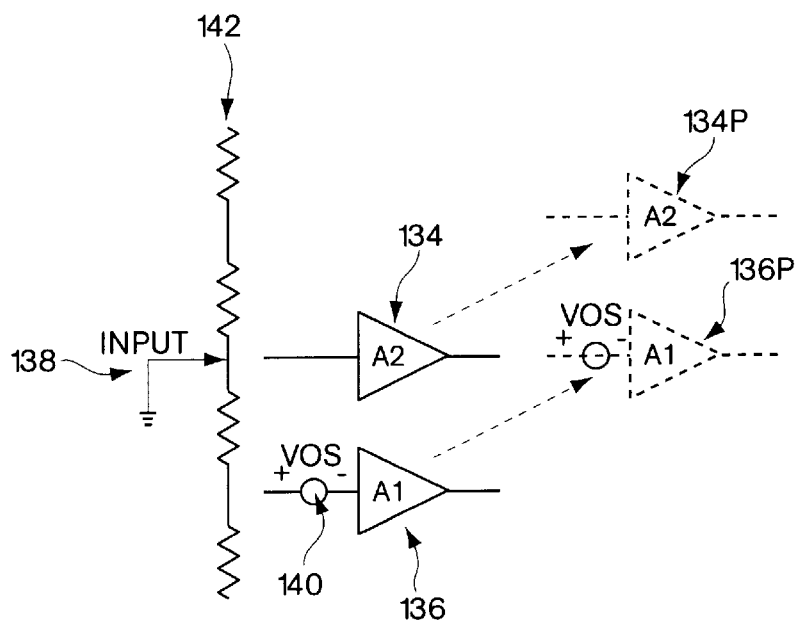
FIG. 13 is a conceptual representation of how a prior art circuit switches the inputs of amplifiers to different nodes of an interpolation ladder in a "sliding" fashion.
Figure 14:
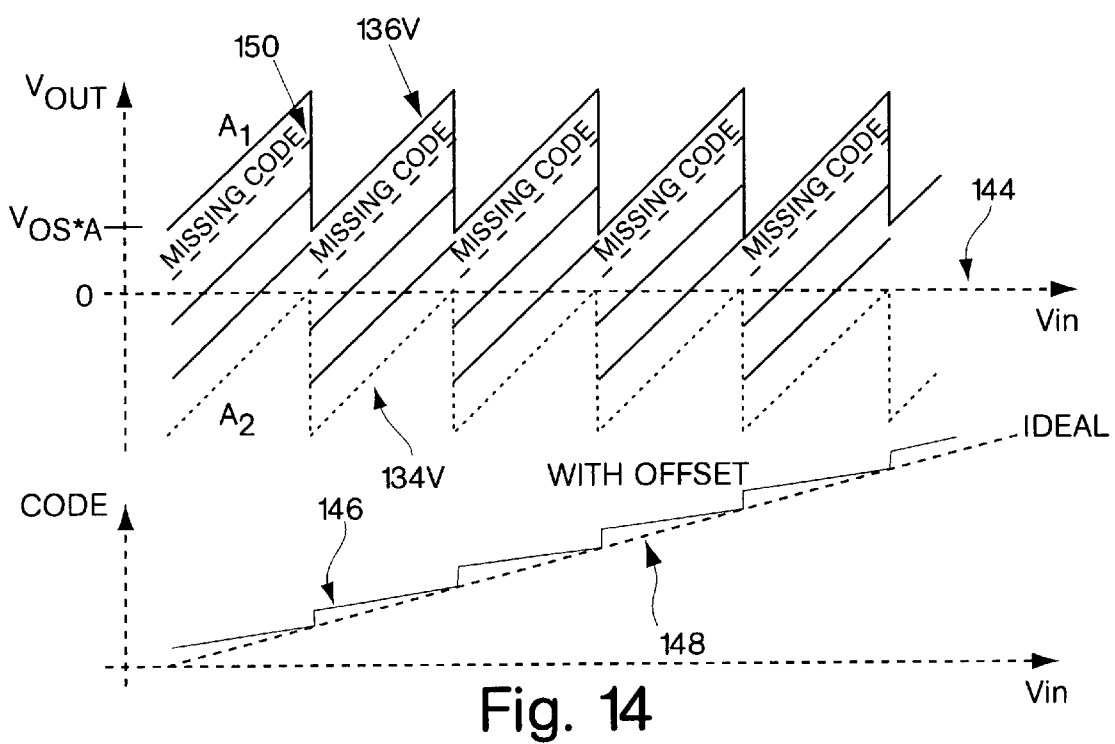
FIG. 14 is a graph showing how the switching scheme shown in FIG. 13 may cause errors in the output code of the ADC.
Figure 15:
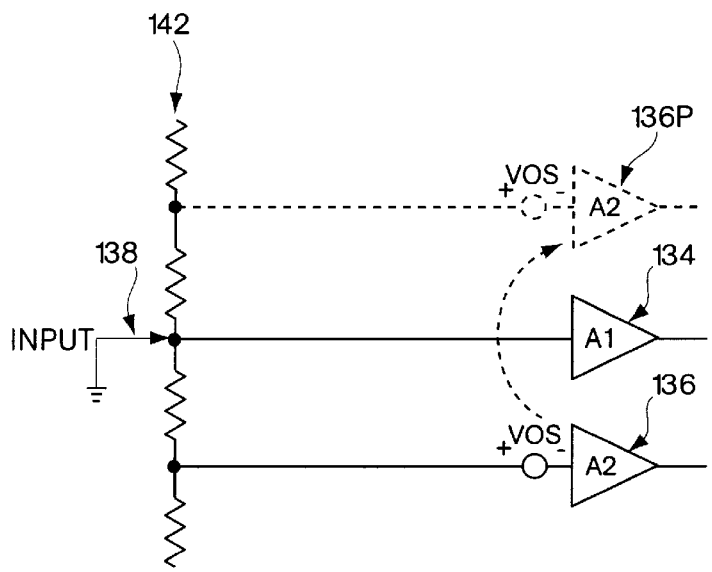
FIG. 15 is a conceptual representation of how a prior art circuit switches the inputs of amplifiers to different nodes of an interpolation ladder in a "leapfrog" fashion.
Figure 16:
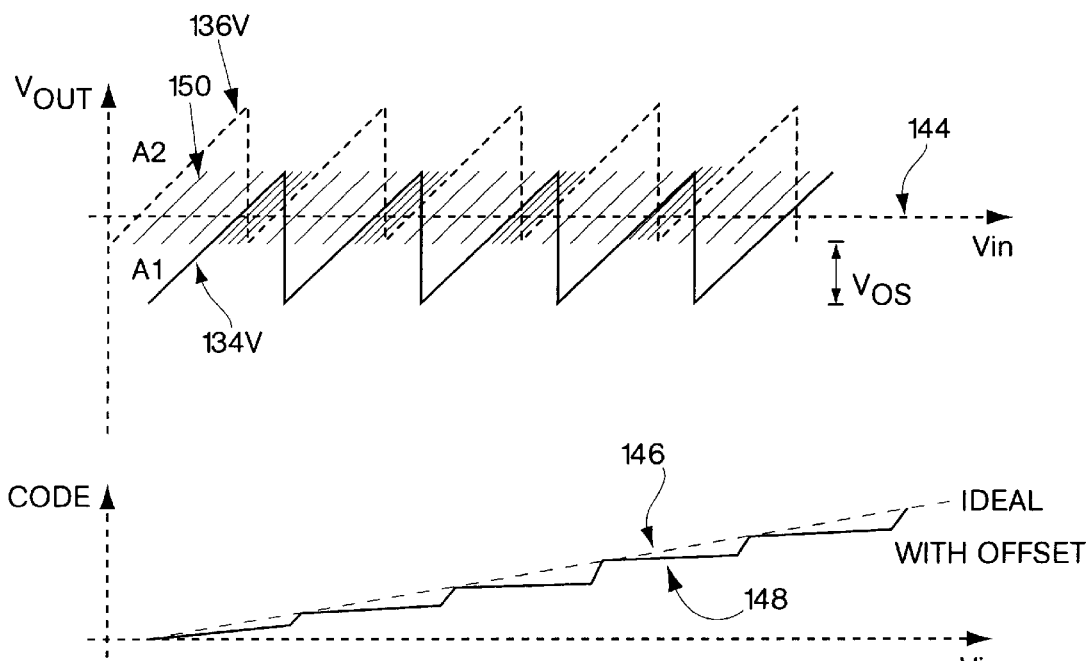
FIG. 16 is a graph showing how the "leapfrog" switching illustrated in FIG. 15 may reduce errors in the output code of the ADC.
Figure 17A:
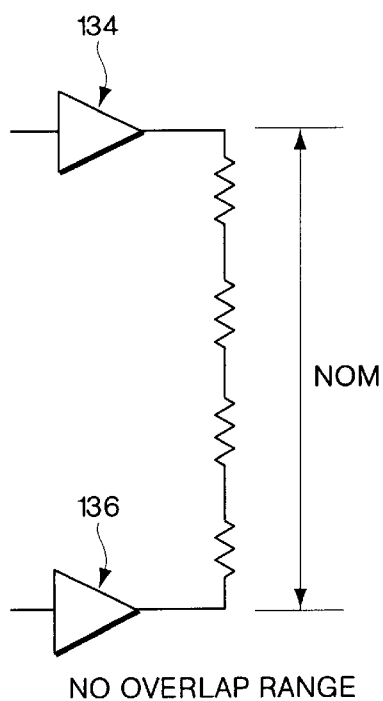
FIG. 17(*a*) is a schematic diagram showing a two-residue interpolation which provides only a nominal conversion range.
FIG. 17(b) is a schematic diagram showing how "over" and "under" conversion regions may be formed artificially in a two-residue architecture.
Figure 17B:
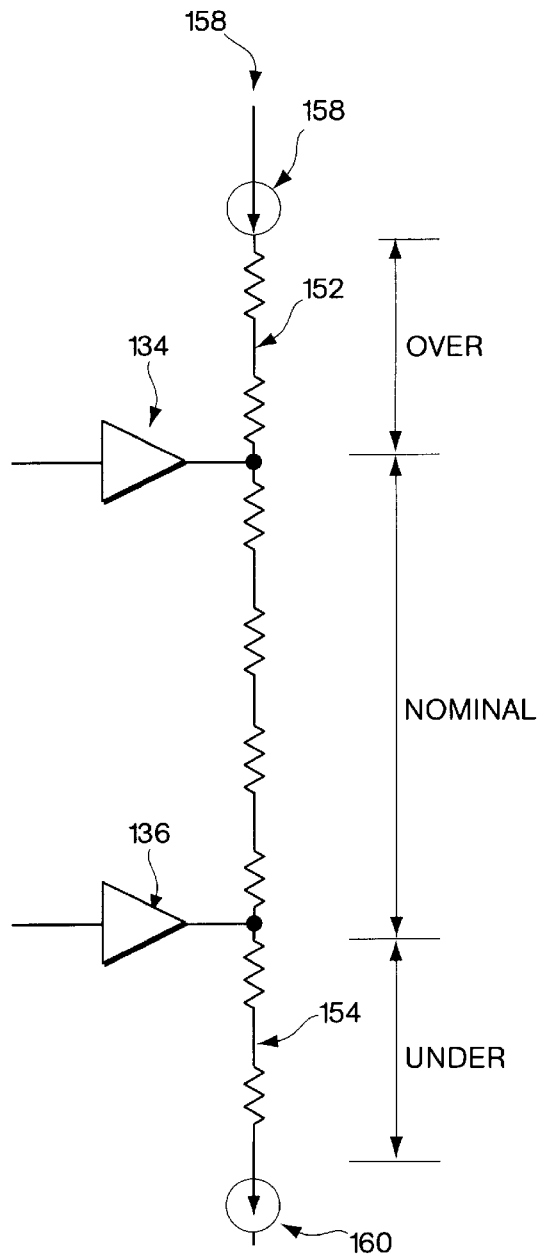
Figure 18:
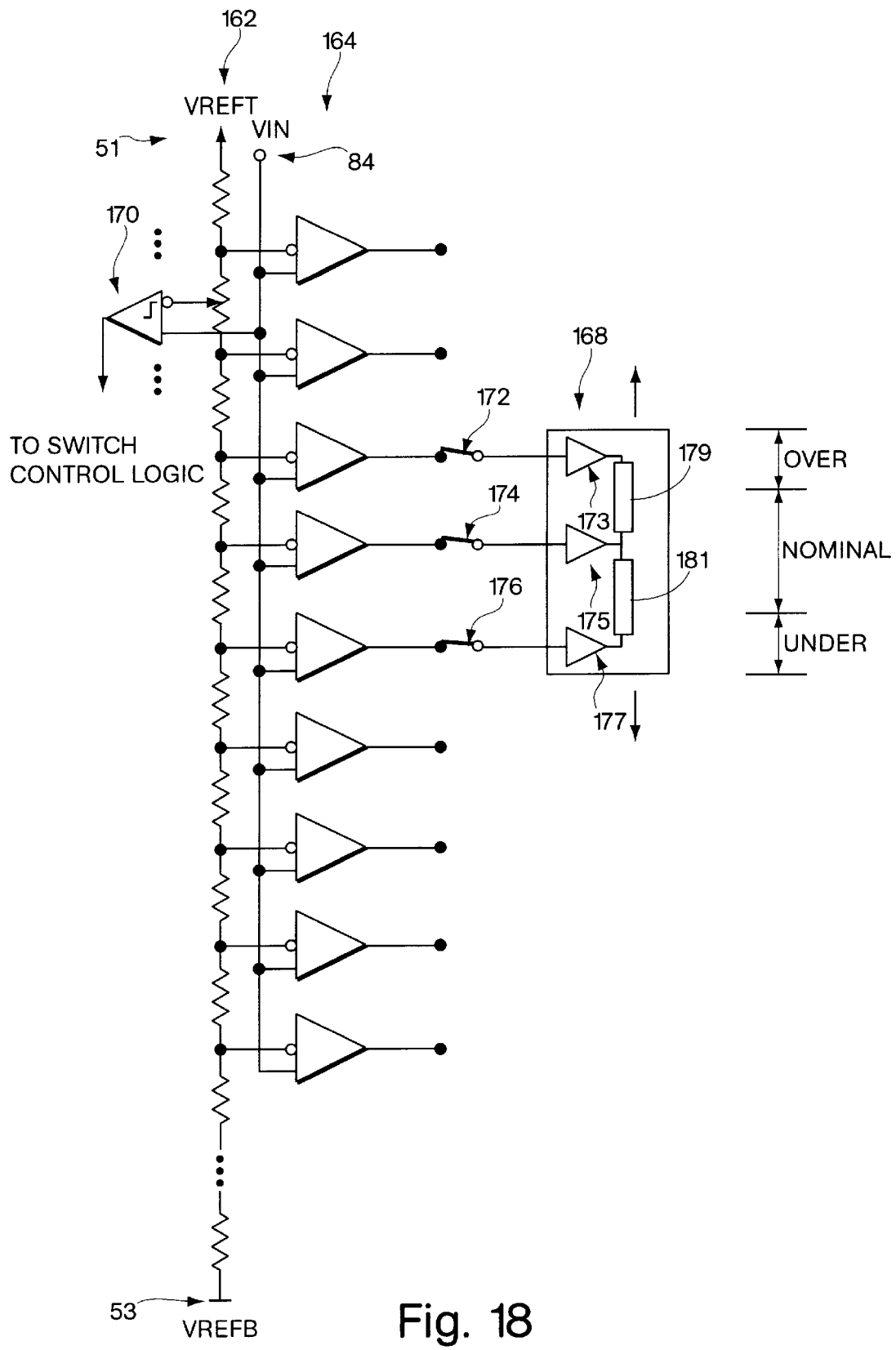
FIG. 18 is a partial schematic/partial block diagram of a prior art interpolating flash ADC which uses the outputs of three adjacent amplifiers to create "over" and "under" conversion regions.
Figure 19:
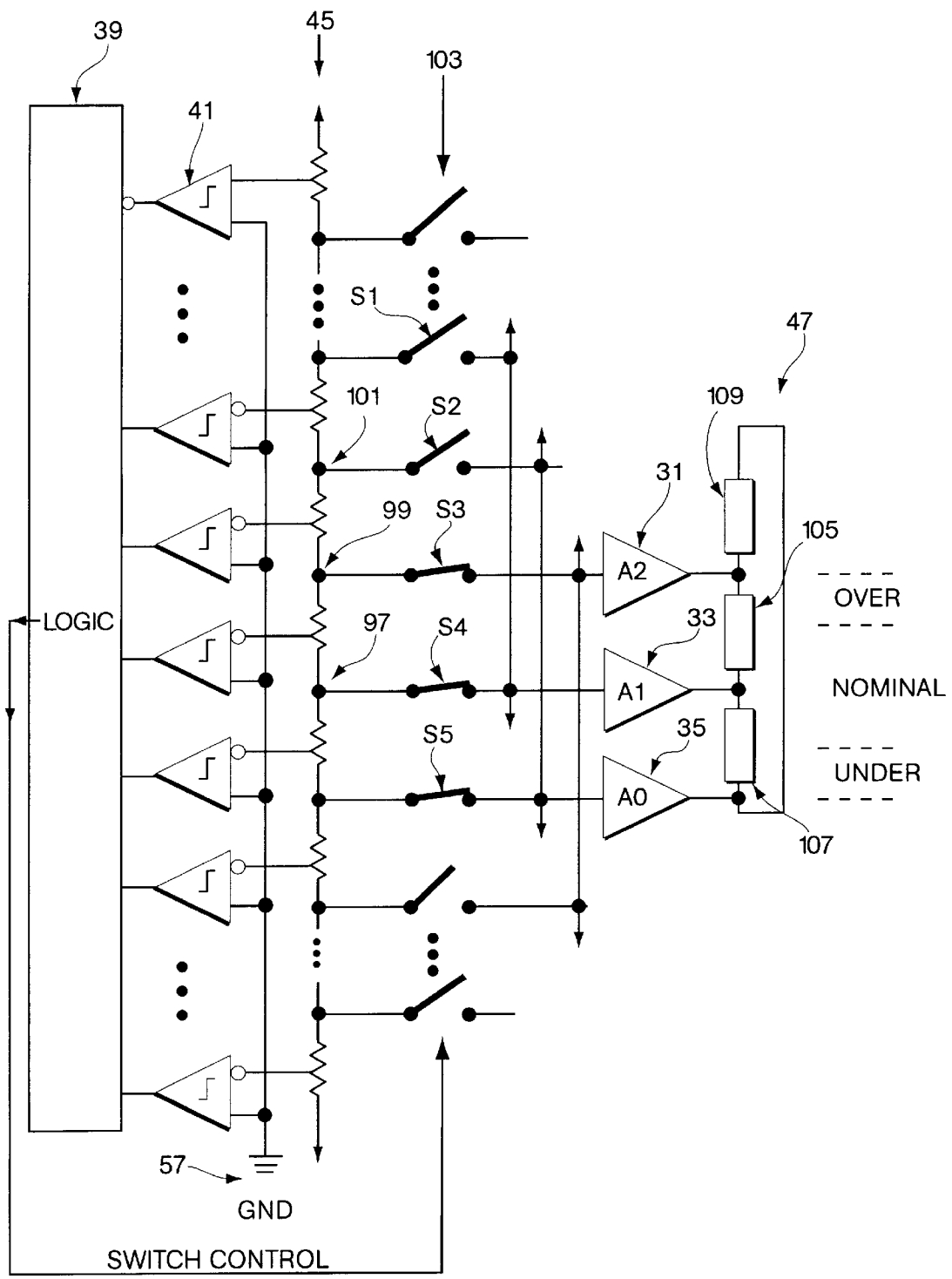
FIG. 19 is a partial schematic/partial block diagram of one embodiment of the present invention.

Several of the drawbacks and disadvantages of prior art interpolating ADCs are overcome by the present invention. One embodiment of the invention is illustrated in FIG. 19. Referring to FIG. 19, interpolation ladder (e.g., resistor ladder) 45 is connected, for example, to the outputs of several amplifiers in an interpolating flash ADC. Therefore, for this exemplary discussion, it will be assumed that a positive voltage is present on one end of resistor ladder 45 and a negative voltage on the other end. Such a voltage gradient will establish a discrete voltage level at each node of the ladder. It also follows that, at some point on ladder 45, the voltage will be equal to zero volts (i.e., there will be a "zero crossing"). The inputs of an array of comparative elements (e.g., the inverting inputs of the comparators in comparator bank 41) each is connected to a midpoint of one resistor of resistor ladder 45 (e.g., each resistor could be formed by two discrete resistors having a midpoint therebetween). Since the non-inverting inputs of the comparators in comparator bank 41 are connected to ground node 57, the output of each of the comparators in comparator bank 41 outputs a logic-low if the voltage at the node of the ladder to which its input connected is at a voltage that is greater than zero volts and outputs a logic-high if the node to which its input is connected is at a voltage that is less than zero volts.

The output of comparator bank 41 then is fed to logic block 39, which logic block determines which of switches S1, S2, S3, S4 and S5, for example, should be closed based on the inputs from comparator bank 41. In order to provide an appropriate "over" and "under" range, inputs to amplifiers 31, 33 and 35 should be connected to resistor ladder 45 such that the middle amplifier (i.e., amplifier 33 in this example) is connected to the node of resistor ladder 45 (with, e.g., switches S1–S5) that has a voltage thereon that is closest to zero volts. In other words, the input of the middle amplifier should be positioned (e.g., using switches S1–S5) to be as close as possible to the "zero crossing" point of resistor ladder 45. One skilled in this art will readily recognize the various means by which this switching may be accomplished based on the high or low logic outputs of comparator bank 41.

In the example shown, because the voltage at node 97 of resistor ladder 45 is the closest to the "zero crossing" point, switches S3, S4 and S5 are closed and all other switches in switch bank 103 are open. If, however, a slight change in the input voltage of the ADC were to cause the "zero crossing" point to move, for example, so that it would be closest to node 99, then switch S5 would open and switch S2 would close so that the input to the input to amplifier 31 (which would then be the middle amplifier) would be closes to the zero crossing point. Similarly, if the "zero crossing" point subsequently moved to node 101, then switch S4 would open and switch S1 would close so that amplifier 35 would then be the middle amplifier. Therefore, responsive to a change in the output of only one of the comparators in comparator bank 41, only one of amplifiers 31, 33 and 35 will be switched so that its input is connected to a new node of resistor ladder 45. This one-at-a-time switching scheme is referred to herein as "leapfrog" switching.

The outputs of amplifiers 31, 33 and 35 are connected to interpolation ladder loop 47. As shown, interpolation ladder loop 47 includes three distinct interpolation ladders 105, 107 and 109 that are connected in a circular fashion. One interpolation ladder is connected between the outputs of every pair of amplifiers. That is, a set of interpolation elements, e.g., a resistor ladder, is connected between: (1) the outputs of amplifiers 31 and 33, (2) the outputs of amplifiers 33 and 35, and (3) the outputs of amplifiers 31 and 35. The "zero crossings" of the voltage levels established by these interpolation ladders may be measured with a quantizer, e.g., a comparator having one input connected to ground, as explained previously. It should be noted, also, that the "nominal" range and the "over" and "under" ranges created by interpolation ladder loop 47 appear between different nodes of interpolation ladder loop 47 corresponding to each "leapfrog" switch of the amplifier inputs such that middle amplifier always drives an interpolation node of resistor ladder loop 47 that is near the middle of the "nominal" quantization range of the ladder.

In the embodiment shown in FIG. 19, the output of comparator bank 41 represents a "coarse" digital approximation of the residue passed to resistor ladder 45 from, for example, the first stage of an interpolating flash converter, and the "zero crossing" quantized by comparators connected to the nodes of interpolation ladder loop 47 could represent a "finer" digital approximation of the residue (i.e., a quantization of the residue). These "coarse" and "fine" digital approximations may be digitally added to the first stage quantization of, e.g., the interpolating flash converter, to produce a digital representation of the input voltage of the ADC.

The circuit shown in FIG. 19 not only will enjoy increased immunity to the offset of the amplifiers and comparators in the circuit (as explained in the description of prior art ADCs), but will consume significantly less power due to the small number of amplifiers and comparators that are required for its implementation. Also, since many bits are converted in successive stages of the converter, fewer bits are required to be converted in the first stage. This factor is important since, if fewer voltage levels are required in the first stage, then the voltage difference between adjacent voltage levels will be substantially larger, thereby reducing the accuracy requirements of the first stage's comparators. This reduction in the accuracy requirement of the comparators will result in a significant power and die area savings for the ADC. Also, as long as the gains of the amplifiers in an amplifier group (e.g., amplifiers 31, 33 and 35) substantially match one another, the absolute gain accuracy of the amplifiers is not essential to the linearity of the circuit. Such a reduction in the required gain accuracy of the amplifiers greatly simplifies the implementation of the circuit. In addition, this combination of factors (i.e., fewer amplifiers and comparators, fewer bits being converted in the first stage and the reduction of the gain accuracy requirements of the amplifiers), makes the invention particularly amenable to implementation using CMOS technology and/or using a low voltage supply, e.g., three volts.

Figure 20:
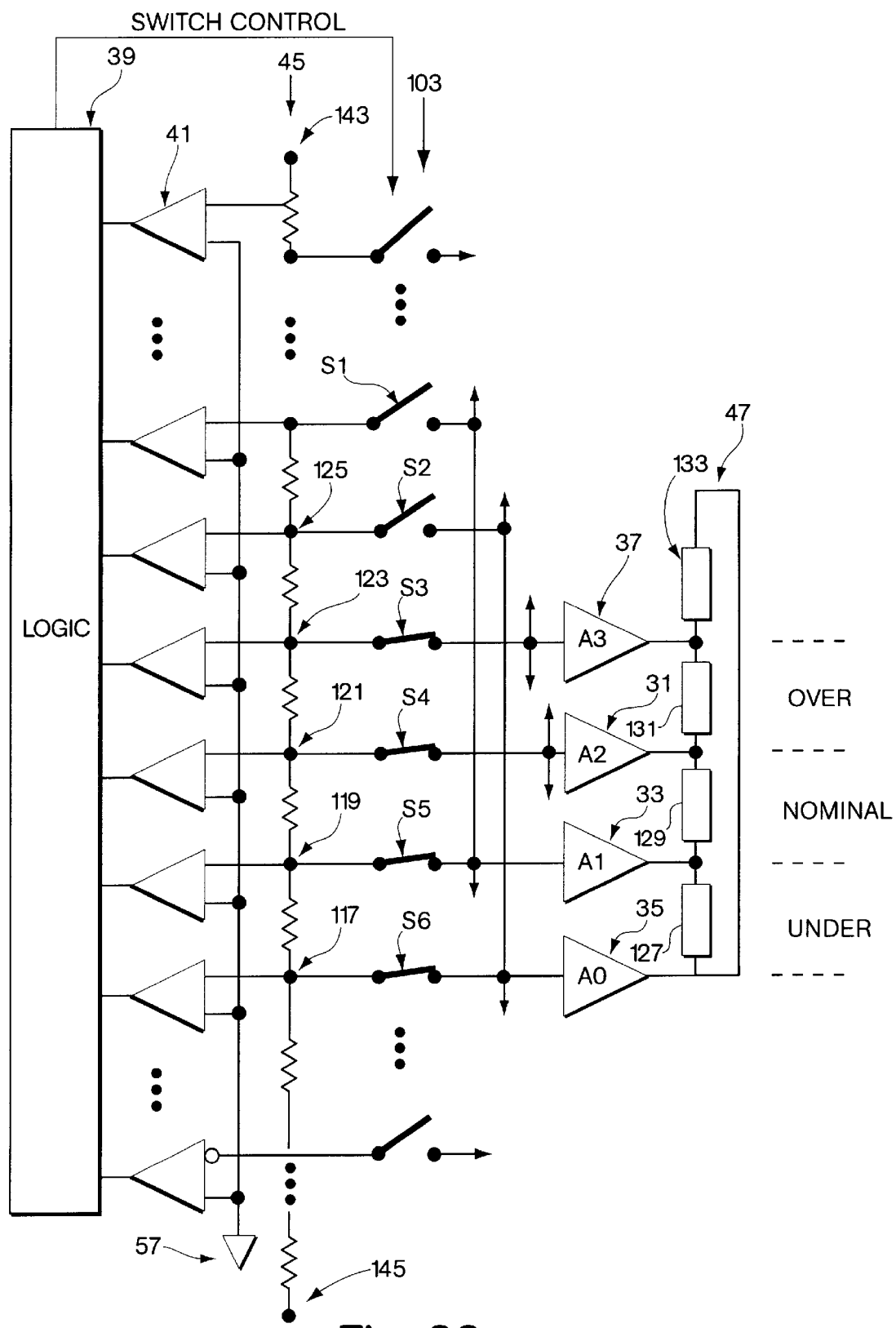
FIG. 20 is a partial schematic/partial block diagram of another embodiment of the invention.

Another embodiment of the invention is illustrated in FIG. 20. This embodiment is similar to the embodiment shown in FIG. 19, except for the addition of amplifier 37 and the reconfiguration of some circuitry to accommodate this fourth amplifier. As shown, comparator bank 41 has its inputs connected to several of the interpolation nodes of resistor ladder 45. Resistor ladder 45 is assumed to have a positive voltage present on one end and a negative voltage on the other (which could, for example, represent the amplified residue of a "coarse" conversion of an interpolating flash converter).

Therefore, at some point on resistor ladder 45, there is a "zero crossing." The location of this "zero crossing" on resistor ladder 45 may be identified by examining the values that are output by comparator bank 41. Logic block 39 performs this examination. That is, logic block 39 receives the outputs of comparator bank 41 and provides control signals that control the switches in switch bank 103 so that the inputs of amplifiers 31, 33, 35 and 37 are connected to four adjacent nodes on resistor ladder 45.

The switches should be controlled such that the two inner amplifiers (which, in the example shown, are amplifiers 31 and 33) are connected to two adjacent nodes (e.g., nodes 119 and 121) of resistor ladder 45 that have, respectively, a positive voltage and a negative voltage thereon. Again, as with the embodiments of the invention shown in FIG. 19, the switches cause the amplifiers to switch in a "leapfrog" manner. That is, assuming that the "zero-crossing" of resistor ladder 45 initially occurred between nodes 119 and 121 (so that the switches were configured as shown) and, then, if the input voltage (to the previous stage) was increased so that the "zero-crossing" next occurred between nodes 121 and 123 of resistor ladder 45, switch S6 would open and switch S2 would close. Similarly, if the input voltage (to the previous stage) were subsequently increased so that the "zero-crossing" next occurred between nodes 123 and 125 of resistor ladder 45, switch S5 would open and switch S1 would close. With each of these "leapfrog" switches of the inputs of the amplifiers, the "nominal" and "over" and "under" ranges are adjusted accordingly. Interpolation ladder loop 47 includes four distinct interpolation ladders 127, 129, 131 and 133, each of which is connected between the outputs of two of amplifiers 31, 33, 35 and 37. The embodiment shown in FIG. 20 benefits from similar advantages as does the embodiment shown in FIG. 19.

Alternatively, in the embodiments of the invention shown in FIGS. 19 and 20, an interpolation ladder (e.g., resistor ladder 45) could be connected between the high and low reference voltages of the circuit in order to establish several discrete voltage levels at the several nodes of the ladder. In such a case, the non-inverting inputs of the comparators in comparator bank 41 would be connected to an input node of the ADC to receive the input voltage $V_{IN}$ (rather than being connected to ground node 57). These comparators, then, could provide a digital code output as well as control the switching of the inputs of the amplifiers in a similar manner as in the other embodiments. Also, in such a case, the voltages at the nodes of the interpolation ladder to which the inputs the amplifiers are switchably connected would need to be amplified in reference to the input voltage $V_{IN}$ of the ADC. Such amplification could be accomplished by using amplifiers having two inputs (i.e., an inverting input and a non-inverting input), and by switchably connecting the nodes of the interpolation ladder to the inverting inputs of the amplifiers and permanently connecting the node which receives the input voltage $V_{IN}$ to the ADC to the non-inverting inputs of all of the amplifiers.

Figure 21:
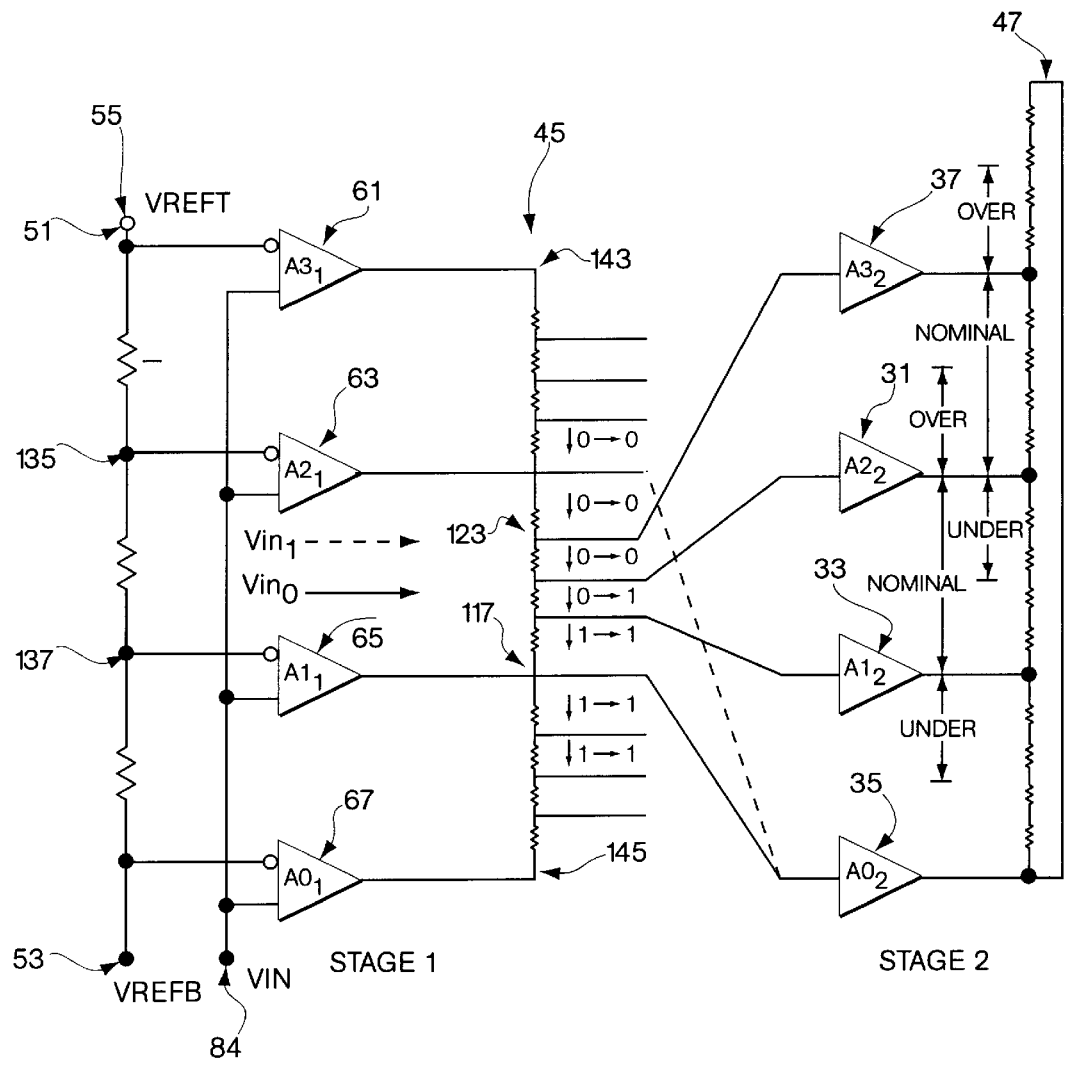
FIG. 21 is a schematic diagram showing one possible implementation of the embodiment of the invention shown in FIG. 20.

FIG. 21 shows an implementation of the embodiment shown in FIG. 20 (with comparator bank 41, logic block 39 and switch bank 103 not shown). As shown in FIG. 21, an interpolation ladder, e.g., resistor ladder 55, establishes several voltage levels between the voltage $V_{REFT}$ and the voltage $V_{REFB}$, which voltages are present at nodes 51 and 53, respectively. Each of the nodes of resistor ladder 55 is connected to an inverting input of one of amplifiers 61, 63, 65 and 67. Input node 84 is connected to the non-inverting inputs of amplifiers 61, 63, 65 and 67. Resistor ladder 45 is connected (at every fourth node) to the outputs of amplifiers 61, 63, 65 and 67. Thus, four interpolated voltages are established between the outputs of each of amplifiers (61 and 63), (63 and 65) and (65 and 67).

Circuit nodes 117, 123, 143 and 145 in the implementation shown in FIG. 21 could correspond with identically labeled nodes in the embodiment of the invention shown in FIG. 20. As depicted in FIG. 21, the output of each of amplifiers 61, 63, 65 and 67 will be positive only if the input voltage $V_{IN}$ is greater than the voltage at the node of resistor ladder 45 to which its inverting input is attached. Similarly, the output of each of amplifiers 61, 63, 65 and 67 will be negative only if the input voltage $V_{IN}$ is less than the voltage at the quantization node to which its inverting input is attached. Therefore, only when the input voltage $V_{IN}$ is between the voltages present at the inverting inputs of two adjacent amplifiers will one output of the two adjacent amplifiers will be positive and the other output of the two adjacent amplifiers be negative. Nevertheless, whenever the input voltage $V_{IN}$ is between the voltages at nodes 51 and 53 (i.e., the input voltage $V_{IN}$ is less than the voltage $V_{REFT}$ and greater than the voltage $V_{REFB}$) the voltage at node 143 will be negative and the voltage at node 145 will be positive.

The inputs of amplifiers 31, 33, 35 and 37 are switchably connected to adjacent nodes of resistor ladder 45. This switching of the inputs of the amplifiers to the nodes of the resistor ladder is explained thoroughly in the description of the embodiment shown in FIG. 20. Given the arrangement shown in FIG. 21, however, since the number of amplifiers having inputs switchably connected to the nodes of a interpolation ladder (i.e., four amplifiers) matches the number of voltage step levels between the outputs of adjacent amplifiers feeding the ladder (i.e., four interpolation nodes), each amplifier always is connected to the same relative position on the ladder.

If capacitive interpolation is used at the inputs of amplifiers 31, 33, 35 and 37 (rather than using resistive interpolation between the outputs of adjacent amplifiers, as shown), then a different capacitive network having different interpolation weights (e.g., factors of 0, ¼, ½ and ¾) normally would have to be switchably connected to the inputs of each of amplifiers 31, 33, 35 and 37. Significantly, therefore, given the implementation shown in FIG. 21, if capacitive interpolation is used, then the same capacitive network (having the same interpolation weights) could be connected permanently to the inputs of each of amplifiers 31, 33, 35 and 37. Again, this advantage is due to the "leap frog" switching of the inputs of one set of amplifiers to the same relative position between outputs of adjacent amplifiers of a previous stage.

Figure 22:
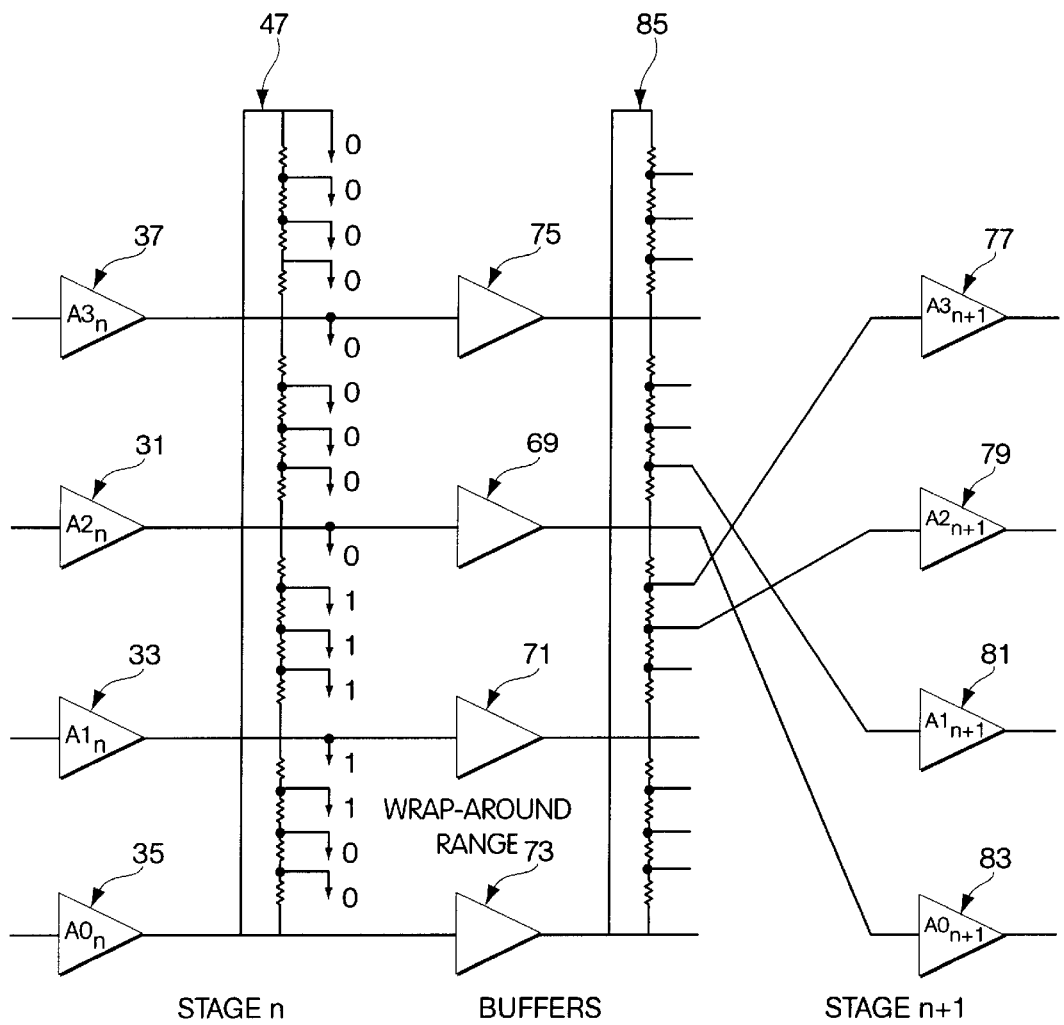
FIG. 22 is a schematic diagram showing a possible multi-stage extension of the implementation of the invention shown in FIG. 21.

Referring now to FIG. 22, an extension of the implementation shown in FIG. 21 is illustrated. In addition to being connected to (every fourth node of) resistor ladder 47, the outputs of amplifiers 31, 33, 35 and 37 are coupled, via buffers 69, 71, 73 and 75, respectively, to (every fourth node of) resistor ladder 85. Resistor ladder 85 is substantially identical to resistor ladder 47. The combination of amplifiers (31, 33, 35, 37, 69, 71, 73 and 75) and resistor ladders (47 and 85) could form one stage of a multi-stage architecture. Amplifiers 77, 79, 81 and 83 (which have inputs that are switchably connected in a "leapfrog" fashion to adjacent nodes of resistor ladder 85) could illustrate, for example, the first amplifier stage of a succeeding pipeline stage according to this implementation of the invention.

As illustrated in FIG. 22, each stage of the pipeline includes a bank of four amplifiers (i.e., amplifiers 31, 33, 35 and 37) and a bank of four buffers (i.e., buffers 69, 71, 73 and 75). The bank of amplifiers and the bank of buffers each drive its own interpolation ladder 47 and 85, respectively. In the exemplary implementation shown, interpolation ladder 47 drives the quantizer for stage n and interpolation ladder 85 drives the amplifiers of stage n+1. The primary purpose of the group of buffers is to provide a pipeline delay. Such a delay is used so that the next stage can switch into place after the quantization, e.g., of interpolation ladder 47, takes place. By having two separate interpolation ladders, the number of required amplifiers per stage is reduced. This reduction occurs because if only one ladder were used, then the second amplifier bank, e.g., the amplifier bank including amplifiers 77, 79, 81 and 83, would require sixteen buffers to buffer the interpolation taps of interpolation ladder 47.

Additional information regarding the design and operation of the present invention may be found in a thesis entitled *Pipelined Multi-step Interpolating A/D Converter,* by Edmond Patrick Coady, shelved on Jul. 17, 1995 at Barker Engineering Library at the Massachusetts Institute of Technology in Cambridge, Mass., which is incorporated herein by reference.

In summary, pipelined multi-step interpolation has the benefits of standard pipelined multi-step architectures. The number of required comparators is reduced greatly. The accuracy requirements of the comparators can be reduced through the implementation of an analog overlap region. Also, by pipelining the architecture, the throughput can be increased dramatically.

By using a multi-residue interpolating architecture, several additional benefits are gained. Most importantly, the absolute gain accuracy requirements of the amplifiers are reduced significantly over the requirements of amplifiers used in single-residue architectures. Also, the settling accuracy requirements of the amplifiers in a multi-residue architecture are greatly reduced (as long as the settling of the amplifiers is linear). As discussed herein, an interpolation architecture is relatively insensitive to interstage gain-errors. Also, offsets in this architecture do not cause significant DNL errors when leapfrogged switching is used. These characteristics ease the design constraints of the amplifiers used in the ADCs. Further, the lowered speed an precision requirements of amplifiers means that the multi-stage, multi-residue ADC circuits according to the invention may operate from lower supply voltages (e.g., three volts) and consume less power than many its predecessor ADC architectures.

It should be understood that while resistive interpolation has been referred to herein, any equivalent type of interpolation, e.g., capacitive interpolation, could equivalently be performed without departing from the intended scope of the invention. In addition, the quantizers and comparators described herein may include any circuit elements that are capable of comparing two signal levels, also without departing from the scope of the invention. Further, while the examples described refer to voltage levels that are created from reference voltages, reference levels could equivalently be established using currents or charges.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A multi-residue interpolating analog-to-digital converter (ADC), comprising:

a first interpolation ladder to establish a first plurality of discrete signal levels at corresponding first nodes of the first interpolation ladder;

at least three amplifiers, each amplifier having an input that is switchably coupled to a selected one of the first nodes when a particular signal is placed at an input of the ADC;

a plurality of comparison components coupled to the first interpolation ladder to compare at least two of the first plurality of discrete signal levels at the first nodes to at least one of a predetermined signal level and an input signal level so as to determine which inputs of the at least three amplifiers should be switchably coupled to which of the first nodes; and a second interpolation ladder coupled to the outputs of the at least three amplifiers to receive signals from the outputs of the at least three amplifiers and establish a second plurality of discrete signal levels at corresponding second nodes of the second interpolation ladder.

2. The multi-residue interpolating ADC as claimed in claim 1, wherein the comparison components are configured such that, responsive to any signal in a nominal signal range of the ADC that is placed at the input of the ADC, the inputs of the at least three amplifiers are switchably coupled to one of adjacent first nodes and every other first node of the first interpolation ladder.

3. The multi-residue interpolating ADC as claimed in claim 2, wherein the comparison components are arranged such that, responsive to a change in an output of only one of the plurality of comparison components, the input of only one of the at least three amplifiers is switched to be coupled to a different first node of the first interpolation ladder.

4. The multi-residue interpolating ADC as claimed in claim 3, wherein the second interpolation ladder is configured in a closed loop.

5. The multi-residue interpolating ADC as claimed in claim 2, wherein the at least three amplifiers comprise a number of amplifiers that is equal to a number of signal level steps included in a nominal conversion range of the first interpolation ladder.

6. The multi-residue interpolating ADC as claimed in claim 1, further comprising:

at least three buffers, an input of each of the at least three buffers being coupled to an output of a different one of the at least three amplifiers; and a third interpolation ladder, which is configured to establish substantially identical signal levels as the second interpolation ladder, coupled to outputs of the at least three buffers.

7. The multi-residue interpolating ADC as claimed in claim 4, wherein the multi-residue interpolating ADC claimed in claim 4 is a single stage of a plurality of stages of a multi-stage multi-residue interpolating ADC, each stage of the plurality of stages including amplifiers having inputs that are switchably coupled to the outputs of the at least three buffers of the previous stage.

8. The multi-residue interpolating ADC as claimed in claim 1, wherein the multi-residue interpolating ADC claimed in claim 1 comprises a single stage of a plurality of stages of a multi-stage multi-residue interpolating ADC.

9. A multi-residue analog-to-digital converter ADC, comprising:

a plurality of amplifiers having outputs to provide amplifier output signals;

a first interpolation ladder coupled to the outputs of the plurality of amplifiers to receive the amplifier output signals and establish a first plurality of discrete signal levels at corresponding first nodes of the first interpolation ladder;

a plurality of buffers having outputs to provide buffered output signals, an input of each of the plurality of buffers being coupled to the output of a different one of the plurality of amplifiers; and a second interpolation ladder, which is configured to establish substantially identical signal levels as the first interpolation ladder, coupled to the outputs of the plurality of buffers to receive the buffered output signals.

10. The multi-residue interpolating ADC as claimed in claim 9, wherein the multi-residue interpolating ADC claimed in claim 9 is a single stage of a plurality of stages of a multi-stage multi-residue interpolating ADC, each stage of the plurality of stages including amplifiers having inputs that are switchably coupled to the outputs of the plurality of buffers of the previous stage.

11. A method for switching inputs of at least three amplifiers to various nodes of a interpolation ladder, including the steps of:

comparing a plurality of discrete signal levels at a plurality of nodes of an interpolation ladder to at least one of an input signal level and a predetermined signal level to establish an output code; and responsive to the output code, leapfrog switching the inputs of the at least three amplifiers to various nodes of the interpolation ladder.

* * * * *

UNITED STATES PATENT AND TRADEMARK OFFICE
CERTIFICATE OF CORRECTION

PATENT NO. : 5,867,116
DATED : February 2, 1999
INVENTOR(S) : Katsufumi Nakamura and Edmond P. Coady It is certified that error appears in the above-indentified patent and that said Letters Patent is hereby corrected as shown below:

IN THE CLAIMS

Column 19, line 2, please replace "4" with --6--.

Column 19, line 3, please replace "4" with --6--.

Signed and Sealed this

Twenty-third Day of November, 1999

Attest:

Q. TODD DICKINSON

Attesting Officer

Acting Commissioner of Patents and Trademarks